(12) United States Patent
Boyd et al.

(10) Patent No.: US 8,018,251 B1
(45) Date of Patent: Sep. 13, 2011

(54) INPUT/OUTPUT INTERFACING WITH LOW POWER

(75) Inventors: Graeme B. Boyd, Vancouver (CA); Guillaume Fortin, Verdun (CA)

(73) Assignee: PMC-Sierra, Inc., Santa Clara, CA (US)

( * ) Notice: Subject to any disclaimer, the term of this patent is extended or adjusted under 35 U.S.C. 154(b) by 0 days.

(21) Appl. No.: 12/791,547

(22) Filed: Jun. 1, 2010

(51) Int. Cl.
*H03K 19/0175* (2006.01)

(52) U.S. Cl. ............... 326/80; 326/62; 326/68; 326/81

(58) Field of Classification Search .................. None
See application file for complete search history.

(56) References Cited

U.S. PATENT DOCUMENTS

| | | |
|---|---|---|
| 6,288,591 B1 | 9/2001 | Riccio |
| 6,351,173 B1 | 2/2002 | Ovens et al. |
| 6,373,315 B2 | 4/2002 | Tsuji et al. |
| 6,700,429 B2 | 3/2004 | Kanno et al. |
| 7,026,855 B2 | 4/2006 | Sueoka et al. |
| 7,205,820 B1 | 4/2007 | Yeung et al. |
| 7,501,851 B2 | 3/2009 | Venditti et al. |
| 2003/0117207 A1 | 6/2003 | Suk et al. |
| 2003/0222701 A1 | 12/2003 | Yang et al. |
| 2005/0237099 A1 | 10/2005 | Tachibana et al. |
| 2005/0285658 A1 | 12/2005 | Schulmeyer et al. |
| 2009/0195292 A1* | 8/2009 | Kanno et al. ............ 327/333 |
| 2011/0031944 A1* | 2/2011 | Stirk et al. ............... 323/234 |

OTHER PUBLICATIONS

American National Standard for Infomraiton Systems; High-Performance Parallel Interface—Mechanical, Electrical, and Signaling Protocol Specification (HIPPI-PH); Feb. 4, 1999.
Telecommunications Industry Association; Electrical Characteristics for an Interface at Data Signaling Rates up to 52 Mbit/s; TIA-612 Apr. 1998; Approved Nov. 2, 2003; Reaffirmed Sep. 10, 1999; Reaffirmed Sep. 14, 2005.
John Goldie; LVDS, CML, ECL-Differential Interfaces with Odd Voltages; Planet Analog; CMP Media LLC.
Paul Shockman; Termination of ECL Devices with EF (Emitter Follower) Output Structure; Apr. 2007—Rev. 6; AND8020/D; ON Semiconductor.

* cited by examiner

*Primary Examiner* — Anh Tran
(74) *Attorney, Agent, or Firm* — Knobbe Martens Olson & Bear LLP

(57) ABSTRACT

Apparatus and methods efficiently provide compatibility between CMOS integrated circuits and voltage levels that are different from that typically used by modern integrated circuits. For example, backwards compatibility can be desirable. Older signaling interfaces operate at different voltage levels than modern CMOS integrated circuits and conventional circuits to interface with these other signaling interfaces exhibit relatively high power consumption. In the context of a transmitter with a P-type substrate, an output driver is embodied in a deep N-well with retrograde P-wells and is biased with voltage biases that can float with respect to the VDD and VSS supplies provided to the CMOS integrated circuit. In the context of a receiver with a P-type substrate, a portion of a receiver is embodied in a deep N-well and biased with floating voltage biases such that the receiver is compatible with signaling received from a signaling technology with disparate voltage levels.

54 Claims, 26 Drawing Sheets

INPUT/OUTPUT INTERFACING WITH LOW POWER

BACKGROUND

1. Field of the Invention

The invention generally relates to electronics, and in particular, to interfacing between circuits of disparate logic families.

2. Description of the Related Art

Various logic families and signaling technologies exist. To allow for backwards compatibility with older equipment or with requirements specifying these older standards, it can be necessary for a device fabricated with a modern CMOS process to provide and/or receive signaling that is compatible with older signaling technology.

FIG. 1 illustrates voltage levels for a variety of signaling technologies. Voltage is expressed along a vertical axis. Time and a variety of signaling technologies are expressed along a horizontal axis. As illustrated in FIG. 1, emitter coupled logic (ECL), positive ECL (PECL), low-voltage positive ECL (LVPECL), and current mode logic (CML) are examples of these older signaling technologies. The signaling technologies described herein can be single-ended or can be differential, that is, have both a true and a false version of the signal. In addition, some of these signaling technologies are not standardized, which can make backwards compatibility even more challenging.

Depending on the application, the signaling signals can be capacitively (AC) coupled or can be direct current (DC) coupled. An example of AC coupling is shown in FIG. 5. It is typically straightforward to interconnect disparate signaling technologies using AC coupling.

However, DC coupling from a modern CMOS integrated circuit (CMOS IC) to an older signaling technology can be difficult. As illustrated in FIG. 1, these older signaling technologies can use different voltage levels than is typically used in a modern CMOS IC. In addition, as illustrated in FIG. 2, there is a limit on maximum working voltage for modern small-geometry devices. In addition, the power consumption associated with the relatively high DC voltage levels of older signaling technologies can be prohibitively high compared with the relatively low power consumption that can be attained by AC-coupled low voltage CMOS drivers and receivers.

Emitter Coupled Logic (ECL)

ECL is a relatively old logic family that has evolved into many families, including 10k, 100k, ECLinPS and RSECL. ECL can be considered to be a de facto standard, but is also specified by ANSI/TIA/EIA-612 "Electrical Characteristics for an Interface at Data Signaling Rates to 52 Mbit/s" as well as a sub-clause within the HIPPI (High-Performance Parallel Interface) ANSI standard.

ECL signals can be used either single-ended or differentially and typically generate between 700 millivolt (mV) to 800 mV peak-differential at the transmitter output. ECL transmitters have low output impedance due to open emitter driver circuits that are operated in the active region, thus providing very fast edge rates. The output is typically terminated into 50Ω to a voltage that is 2 volts below ground (or the positive rail). ECL components are usually powered between ground (positive rail) and −5.2 V (negative rail). Other ECL configurations can be single or double terminated, but are typically terminated only at the receiver end with external resistors.

FIG. 3 illustrates a typical bipolar implementation of an ECL input/output circuit, and FIG. 4 illustrates corresponding input/output levels. Because of voltage level incompatibilities between CMOS and ECL, for example, CMOS uses positive voltages whereas ECL uses negative voltages, CMOS and ECL are typically interconnected using AC coupling with coupling capacitors as illustrated in FIG. 5.

However, with a CMOS process that supports Deep N-well and retrograde P-wells (assuming a P-substrate), it is possible to have a DC coupled connection as illustrated in FIG. 6, assuming that the MOS devices can withstand the DC voltages as described earlier in connection with FIG. 2.

The primary areas of high power consumption are: 1) termination; and 2) output drive and pre-drive stages. The termination power consumption corresponds to the power in the input termination resistors. FIGS. 7A-7C illustrate various examples of termination. Table 1 summarizes applicable resistor values for various voltage levels.

TABLE 1

| | Termination Resistor Values | | |
|---|---|---|---|
| | \|VCC − VEE\| = 2.5 V | \|VCC − VEE\| = 3.3 V | \|VCC − VEE\| = 5 V |
| R1 | 249 | 127 | 82.5 |
| R2 | 61.9 | 82.5 | 124 |
| RT | 49.9 | 49.9 | 49.9 |
| RT1 | 21 | 46.4 | 113 |

VCC and VEE can be analogous to VDD and VSS. The VTT supply termination illustrated in FIG. 7B will have slightly more power than the Y connection illustrated in FIG. 7C unless a switching regulator is used (due to regulator overhead). The termination power consumption can be calculated as shown in Equations 1A-1E.

$$\text{Power}_{R1,R2} \approx 2 * \frac{|VCC - VEE|^2}{R1 + R2} \quad \text{(Eq. 1A)}$$

$$\text{Power}_{RT,RT1} \approx \frac{|VIL - VTT|^2}{RT} + \frac{|VIH - VTT|^2}{RT} + \frac{|VTT - VEE|^2}{RT1} \quad \text{(Eq. 1B)}$$

$$VTT = VCC - 2 \quad \text{(Eq. 1C)}$$

$$VIL = VCC - 1.6425 \quad \text{(Eq. 1D)}$$

$$VIH = VCC - 1.0225 \quad \text{(Eq. 1E)}$$

The output stage power consumption is 15.4 mA*|VCC−VEE|. Hence, the sum of the termination power consumption and the output stage power consumption (termination power consumption figures include a standard linear regulator power if applicable and output stage power) is as shown in Table 2.

TABLE 2

| | Termination Power | | |
|---|---|---|---|
| \|VCC − VEE\| | | Typical Power (mW) | |
| Voltage | R1, R2 | RT, RT1 | RT, VTT |
| 2.5 | 79 | 72 | 72+ |
| 3.3 | 155 | 109 | 109+ |
| 5 | 319 | 178 | 178+ |

Positive Emitter Coupled Logic (PECL)

The PECL family uses a positive 5 V rail to ground for the voltage bias supplies rather than the ground to −5.2 V voltage bias that is used by some other families of ECL, such as the 10 KH family. A conventional technique to interconnect a CMOS interface to a PECL circuit is shown in FIGS. 8A and 8B, and assumes that the MOS devices are able to withstand the DC voltages present. The primary areas of high power consumption are again: 1) termination; and 2) output drive and pre-drive stages. The power consumption of the CMOS to PECL interconnection is about the same as for the 5V ECL case described earlier in connection with Table 2.

Low Voltage Positive Emitter Coupled Logic (LVPECL)

The LVPECL family is PECL with a positive 3.3 V rail to ground for the voltage biases instead of the positive 5 V rail to ground that used by PECL. A conventional technique to interconnect a CMOS interface to a PECL interface described earlier in connection with FIGS. 8A and 8B is also applicable to LVPECL, and assumes that the MOS devices are able to withstand the DC voltage levels present. The primary areas of high power consumption are: 1) termination; and 2) output drive and pre-drive stages. The power consumption of the CMOS to LVPECL interconnection is about the same as for the 3.3V ECL case described earlier in connection with Table 2.

Current Mode Logic (CML)

CML signaling technology is not standardized. However, there are two common-used CML configurations referred to as: 1) 3.3 V CML and 2) 1.2 V CML. These two common types are the similar except for the positive voltage used. CML is similar to PECL, but without the open emitter device. A conventional example of CML signaling implemented with bipolar transistors is illustrated in FIG. 9. CML uses resistors for pull ups and switches current for pull down. As such, it is simpler than ECL/PECL and as it has both Tx and Rx termination as part of the driver/receiver, it typically has better signal integrity (SI) than ECL/PECL and can typically operate at higher speeds than ECL/PECL. The signal swing can vary in a relatively wide range, but most configurations use a 400 mV peak differential swing. FIGS. 10A and 10B illustrate a conventional CMOS implementation of CML assuming that the MOS devices can withstand the DC voltages present.

The primary areas of high power consumption are: 1) termination and output drive; and 2) pre-drive and level shifter stages. However, the power consumption of the pre-driver and level shifter is relatively small compared to the termination and output drive, and can thus be ignored for analysis. FIG. 11 illustrates a typical termination power for both the 1.2 V and the 3.3 V CML interface cases.

CMOS Voltage Mode Driver

A CMOS Voltage Mode Driver is described in commonly-owned U.S. Pat. No. 7,501,851. FIG. 12 herein illustrates a relatively large CMOS inverter with series resistors RT used to partially set the output impedance of the driver. The driver is not the signaling interface itself, but rather a technique to drive a signaling interface. Control of the Tgates permits the output impedance to be corrected and the output swing to be varied.

The CMOS Voltage Mode Driver can be used within CMOS devices, along with external AC coupling, to separate the driver common mode (VDD_driver/2) level from the receiver common mode level. The power consumption is relatively low as illustrated in FIG. 13 and in Table 3.

TABLE 3

AC Coupled Voltage Mode Termination Power (mW)

| | VDD Voltage of Modern CMOS Processes | | | |
|---|---|---|---|---|
| | 0.8 V | 0.9 V | 1 V | 1.2 V |
| Output Voltage swing (Vppd) | 0.8 | 0.9 | 1.0 | 1.2 |
| Driver Termination Power | 1.6 | 2.0 | 2.5 | 3.6 |
| Receiver Termination Power | 1.6 | 2.0 | 2.5 | 3.6 |
| Total Termination Power | 3.2 | 4.1 | 5.0 | 7.2 |

SUMMARY

It is often desirable for a modern CMOS integrated circuit to be compatible with voltage levels that are different than the standard voltage levels of the modern integrated circuit. For example, backwards compatibility can be desirable for compatibility with older signaling interfaces, such as PECL, LVPECL, CML, or the like, which operate at different voltage levels than modern CMOS integrated circuits. When DC coupling is used, the DC coupling exposes the modern CMOS integrated circuit to voltage levels that are atypical for modern CMOS integrated circuits. Another problem that plagues conventional DC-coupled implementations is relatively high power consumption.

Embodiments of the invention advantageously provide a relatively low power technique of DC coupling to other voltage signaling interconnects, such as to the older signaling interfaces. Current CMOS processes, such as those below 90 nanometer geometry, typically use VDD voltage biases between about 0.8 V to about 1.2 V. Even with these relatively low voltage bias levels, a modern CMOS circuit has a large enough signal swing to be compatible with even an older technology interface notwithstanding the DC level differences encountered during DC coupling. Embodiments of the invention combine the power efficient advantages of AC coupling and the compatibility of DC coupling. Embodiments of the invention are compatible with both AC coupling and with DC coupling.

Embodiments of the invention can be implemented with either P-type substrates or N-type substrates. In the context of P-type substrates, an embodiment of the invention includes a deep N-well with retrograde P-wells within the integrated circuit to prevent voltage breakdown. An output driver circuit within the deep N-well is biased with voltage biases that can float with respect to the VDD and VSS supplies provided to the CMOS integrated circuit. In a modern, small-geometry CMOS integrated circuit, VDD or AVD is typically between about 0.8 V to about 1.2 V, and VSS or AVS is typically ground (0 V). Switching voltage regulators, which can be very efficient, can be used to generate new voltage biases indicated in the drawings as new_AVD and new_AVS, which float with respect to VDD and VSS or AVD and AVS. These various voltage levels and their corresponding grounds can be referred to as voltage references. A level shifting circuit, a portion of which can also be in the deep N-well, shifts signal levels from the normal CMOS portion of the CMOS integrated circuit to a different voltage level for compatibility with the driver(s) that are biased with new_AVD and new_AVS. Any suitable level shifting circuit can be used, including conventional level shifting circuits and level shifting circuits yet to be developed.

Similar techniques can be applied to a receiver such that a portion of a receiver is in a deep N-well and biased with floating voltage biases such that the receiver is compatible with signaling received from a signaling technology with disparate voltage levels, such as the older signaling technologies previously described.

BRIEF DESCRIPTION OF THE DRAWINGS

These drawings and the associated description herein are provided to illustrate embodiments and are not intended to be limiting.

DETAILED DESCRIPTION OF SPECIFIC EMBODIMENTS

Although particular embodiments are described herein, other embodiments of the invention, including embodiments that do not provide all of the benefits and features set forth herein, will be apparent to those of ordinary skill in the art. While described in the context of CMOS integrated circuits having P-type substrates, the principles and advantages described herein are also applicable to CMOS integrated circuits having N-type substrates. In addition, while the following embodiments are described in the context of differential signals, the principles and advantages described herein are applicable to both single-ended signals and differential signals.

Low Power CMOS Implementation of PECL and CML Input/Output Circuits

Figure 1:
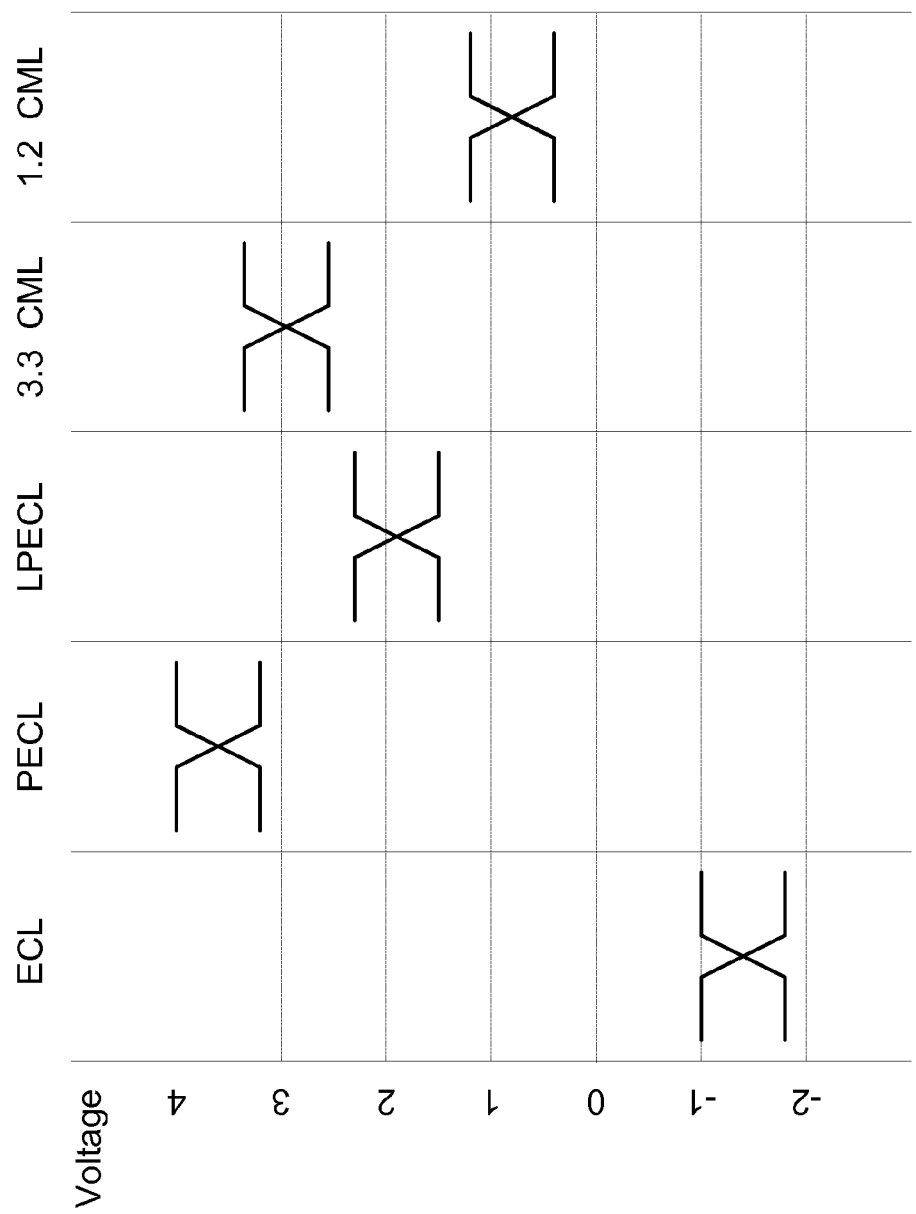
FIG. 1 illustrates voltage levels for a variety of signaling technologies.
Figure 2:
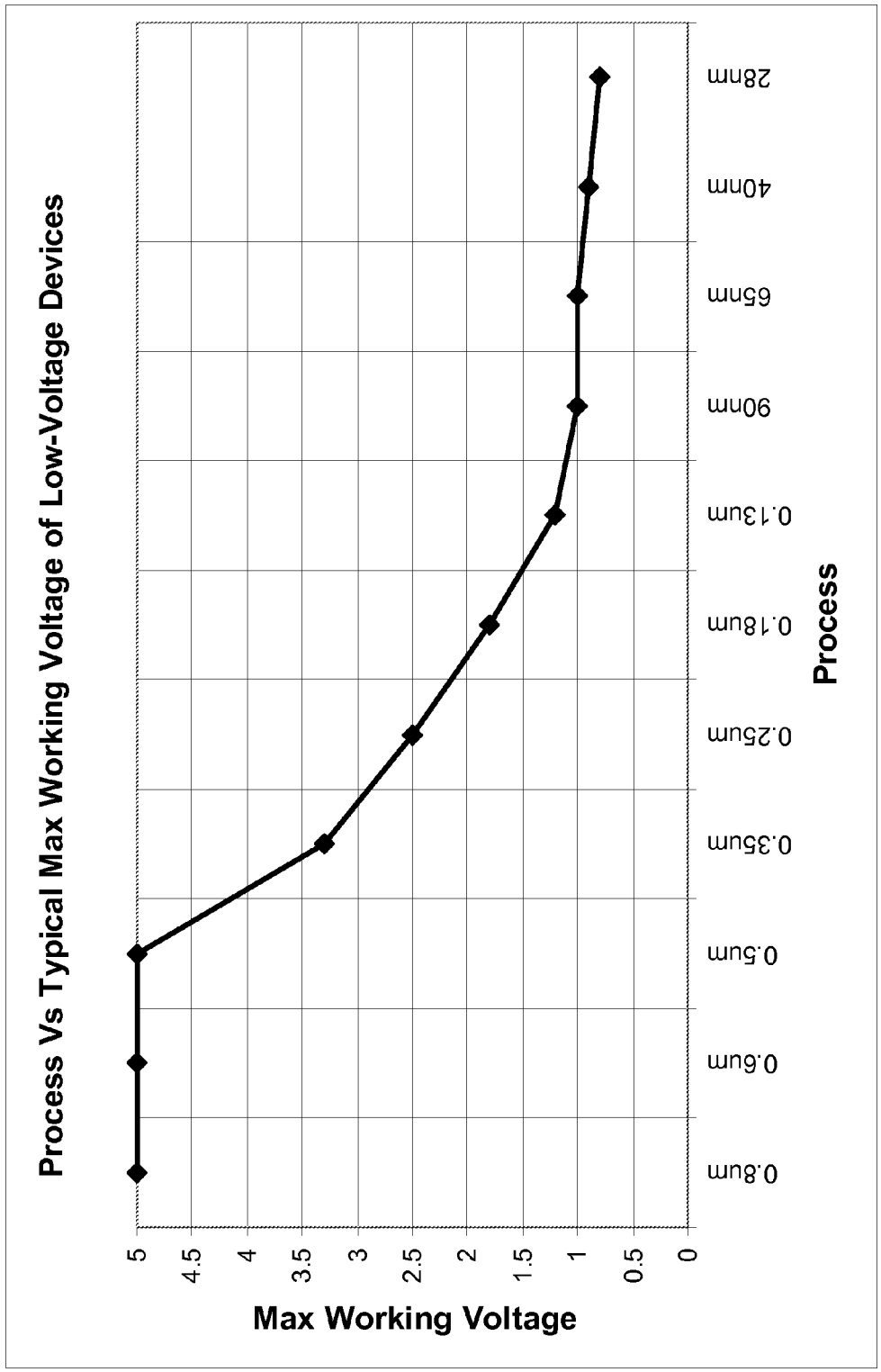
FIG. 2 is a chart illustrating process technology versus maximum working voltage for MOS transistors.
Figure 3:
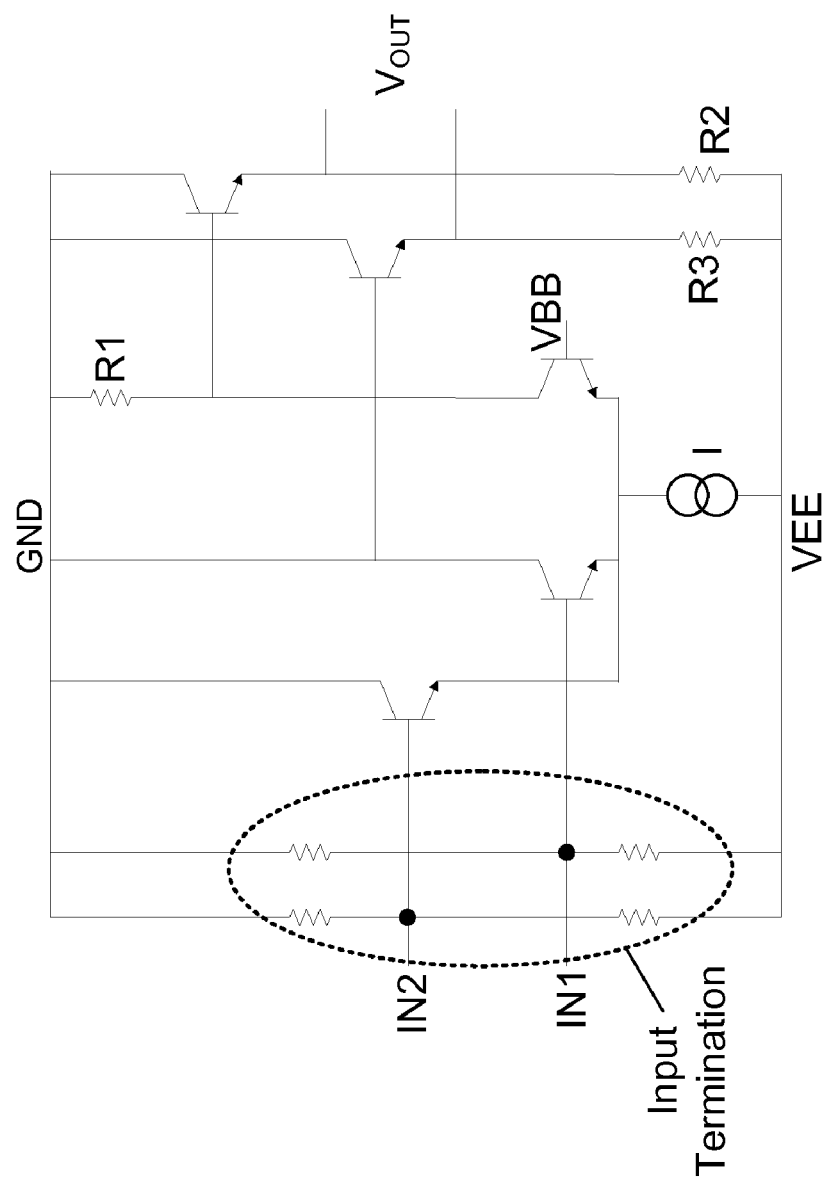
FIG. 3 illustrates a conventional bipolar transistor implementation of an ECL interface.
Figure 4:
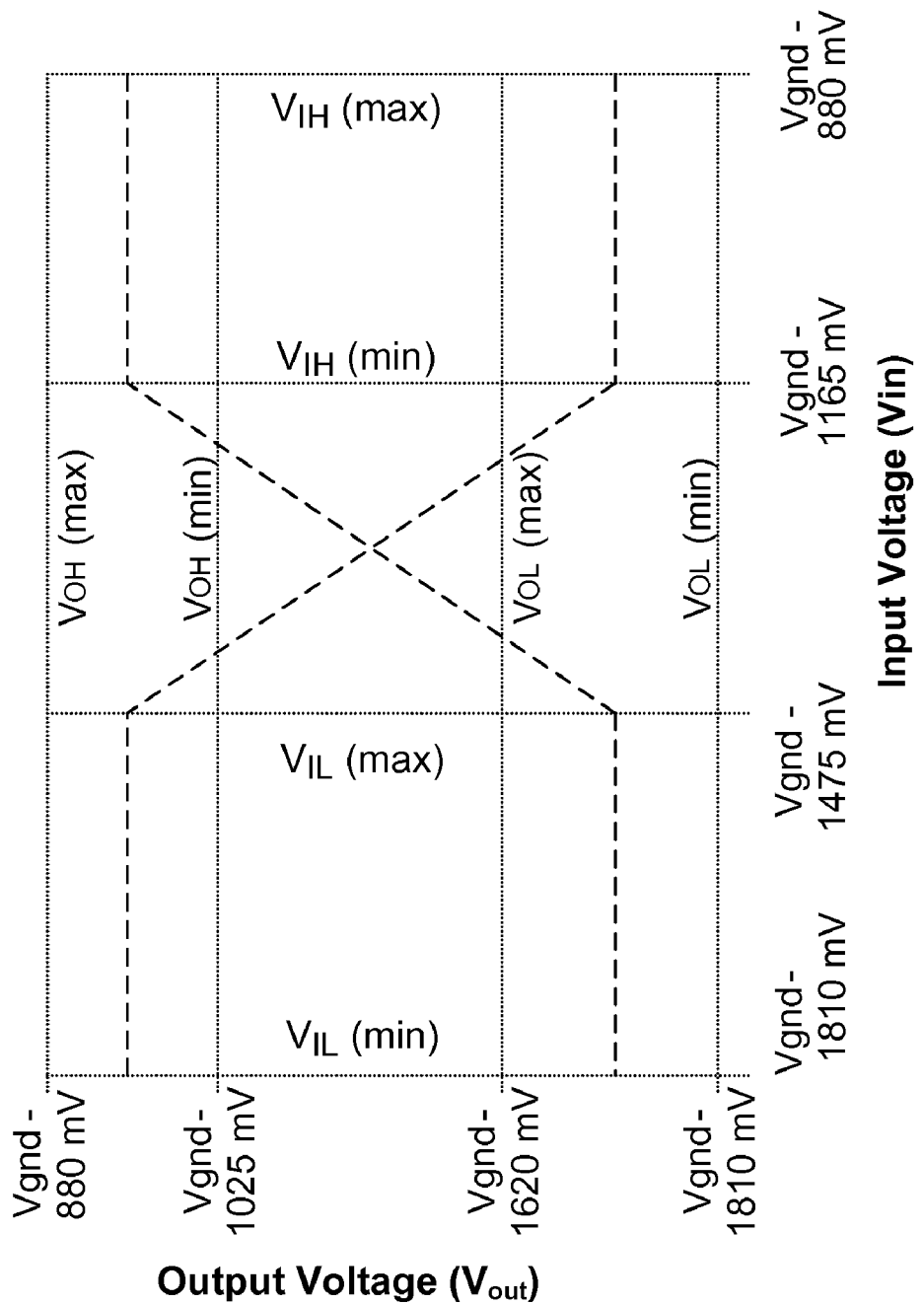
FIG. 4 illustrates typical ECL signaling levels.
Figure 5:
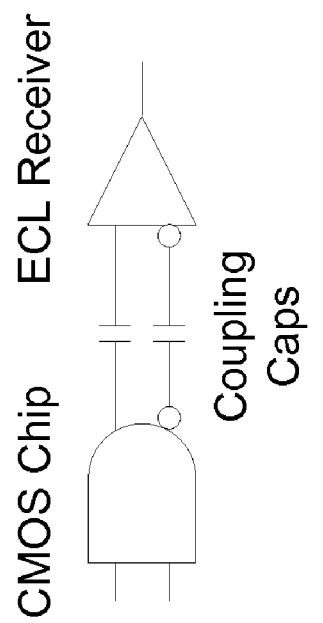
FIG. 5 illustrates a conventional AC-coupled CMOS to ECL connection.
Figure 6:
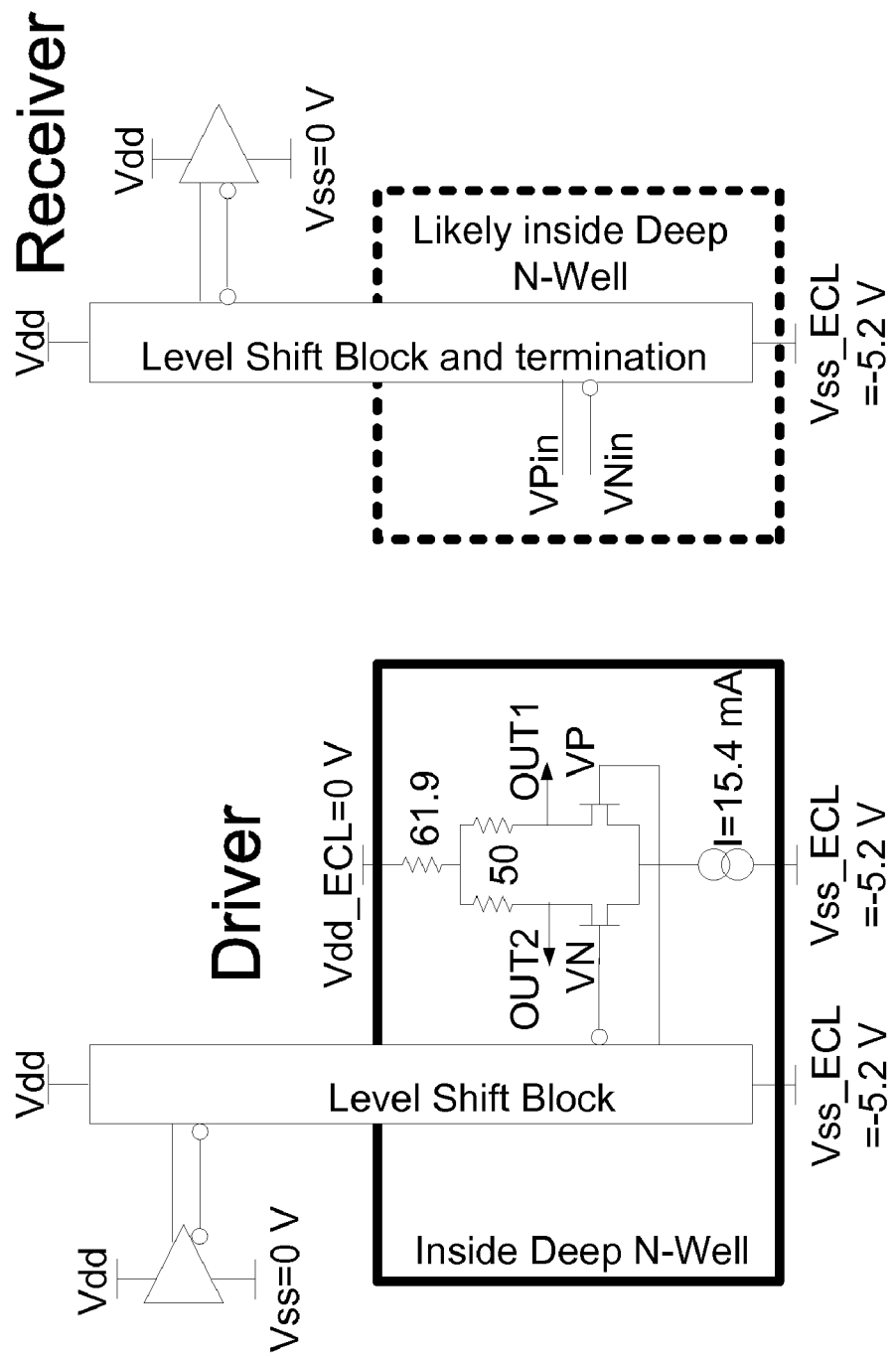
FIG. 6 illustrates a conventional example of an ECL interface implemented with MOS transistors instead of bipolar transistors.
Figure 7C:
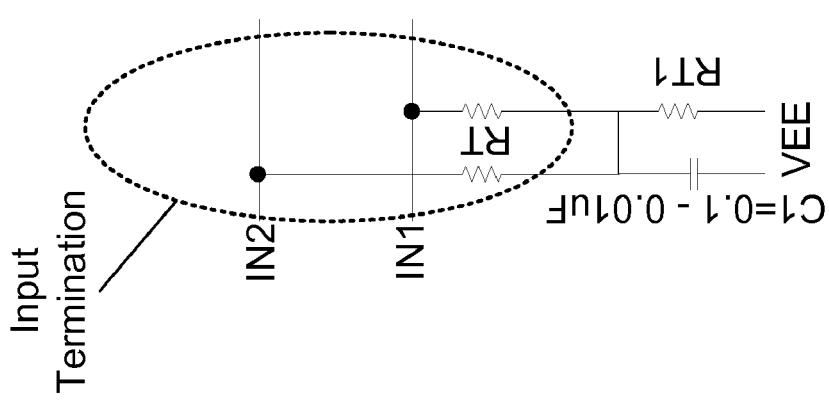
FIGS. 7A-7C illustrate various ways to implement an ECL termination for a receiver.
Figure 7B:
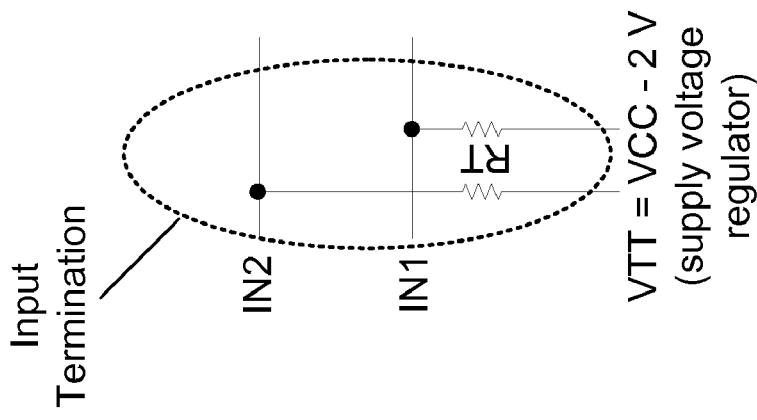
Figure 7A:
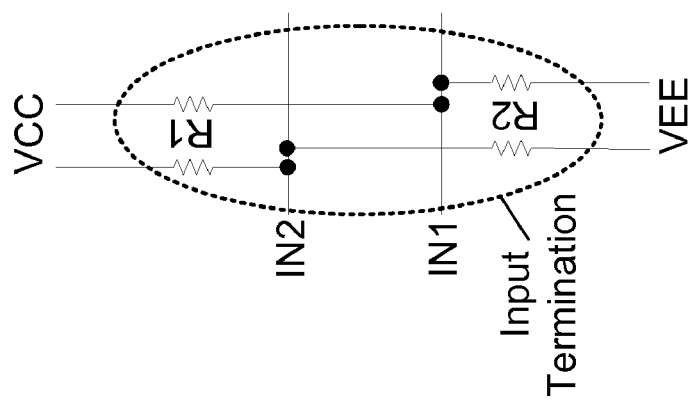
Figures 8A, 8B:
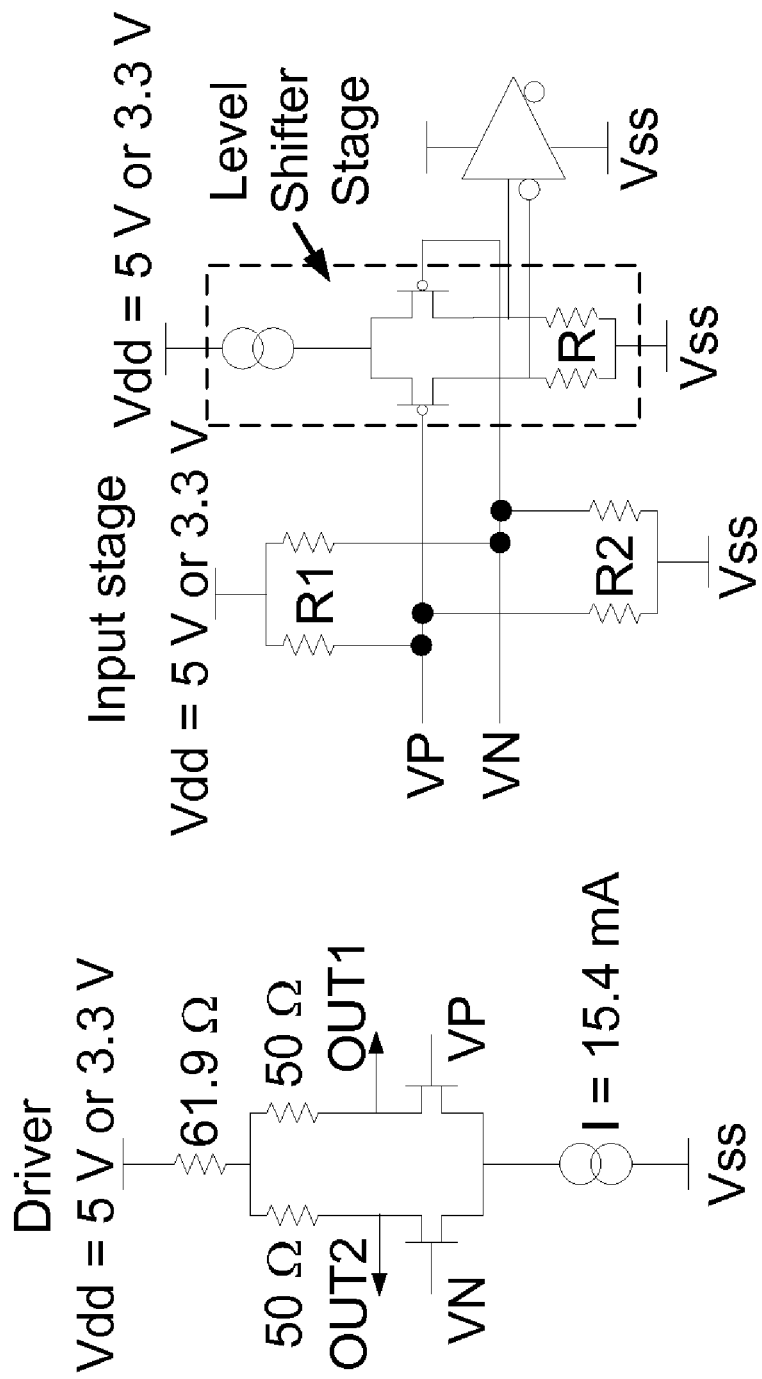
FIGS. 8A and 8B illustrate a conventional example of a PECL or an LVPECL interface implemented with MOS transistors.
Figure 9:
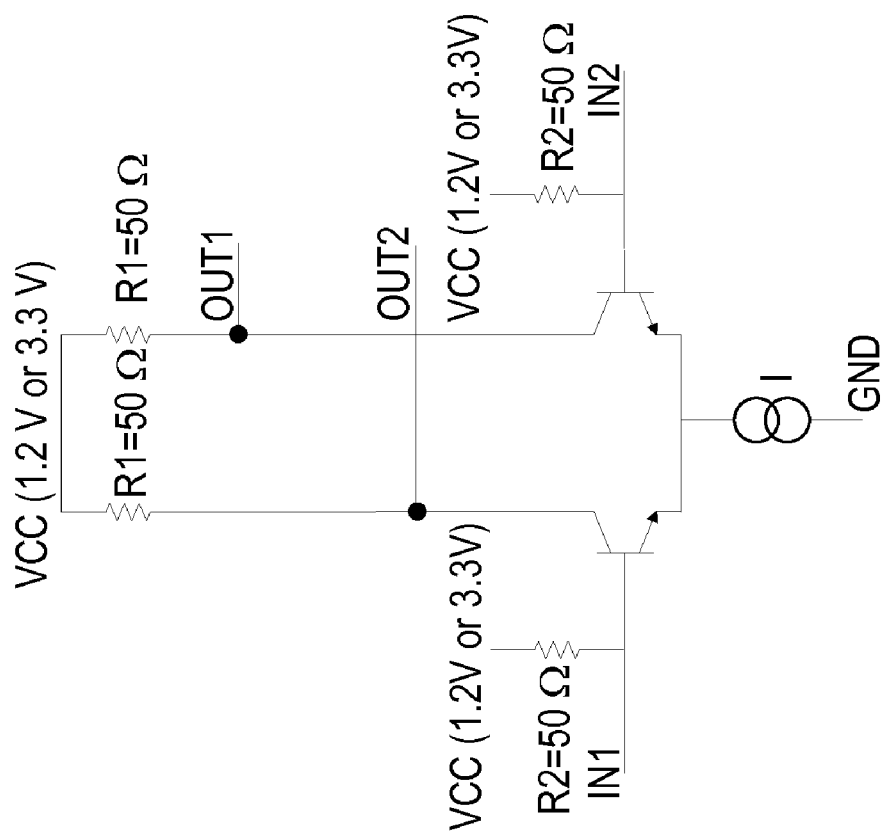
FIG. 9 illustrates a conventional example of a CML interface implemented with bipolar transistors.
Figure 10B:
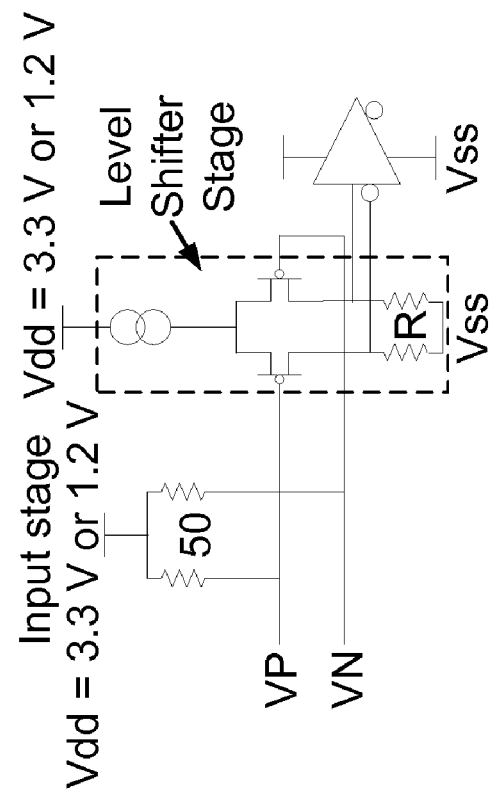
FIGS. 10A and 10B illustrate a conventional example of a CML interface implemented with MOS transistors.
Figure 10A:
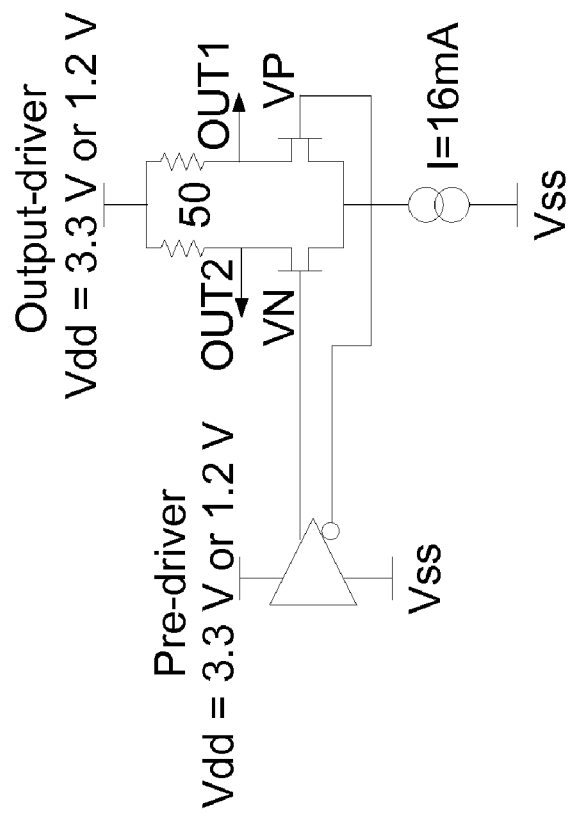
Figure 11:
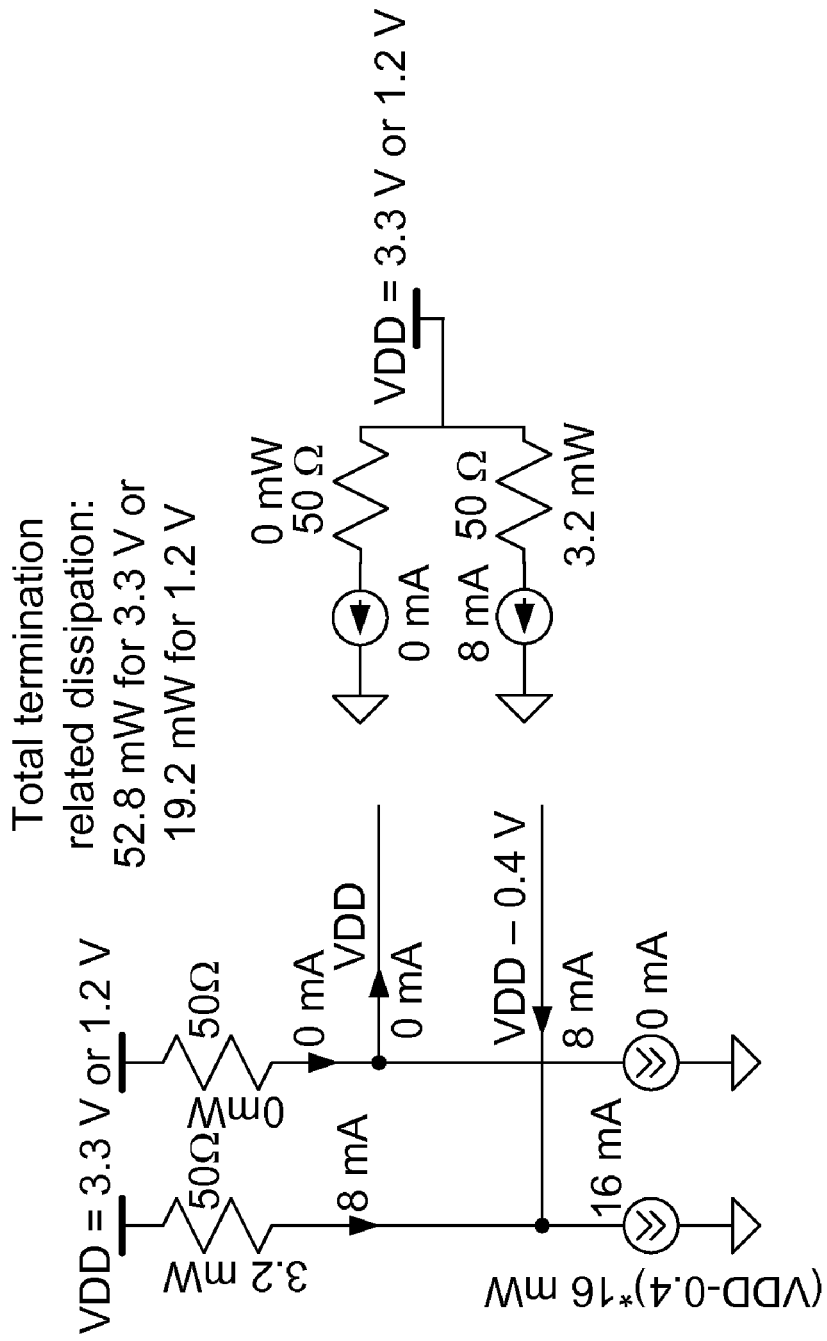
FIG. 11 illustrates a calculation of a typical termination power for a CML interface.
Figure 12:
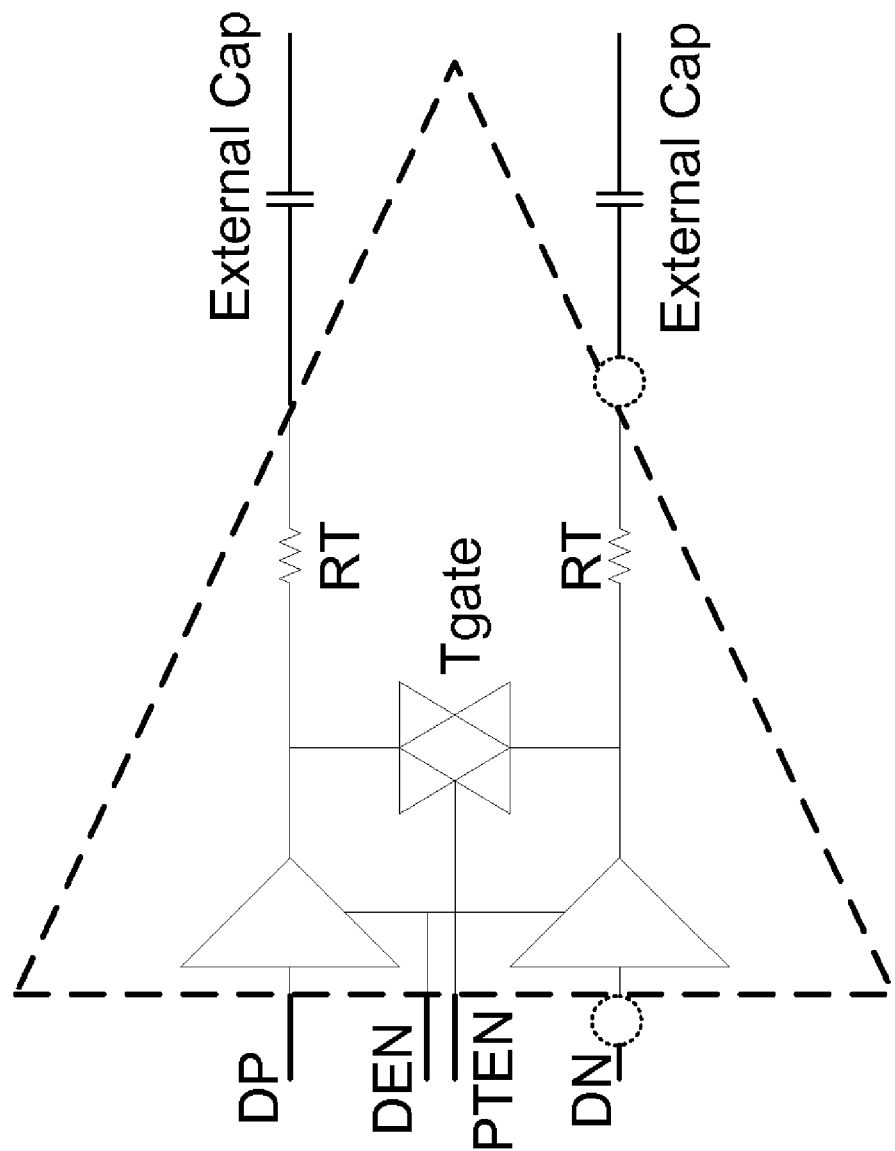
FIG. 12 illustrates an example of a conventional CMOS voltage mode driver with external AC coupling capacitors.
Figure 13:
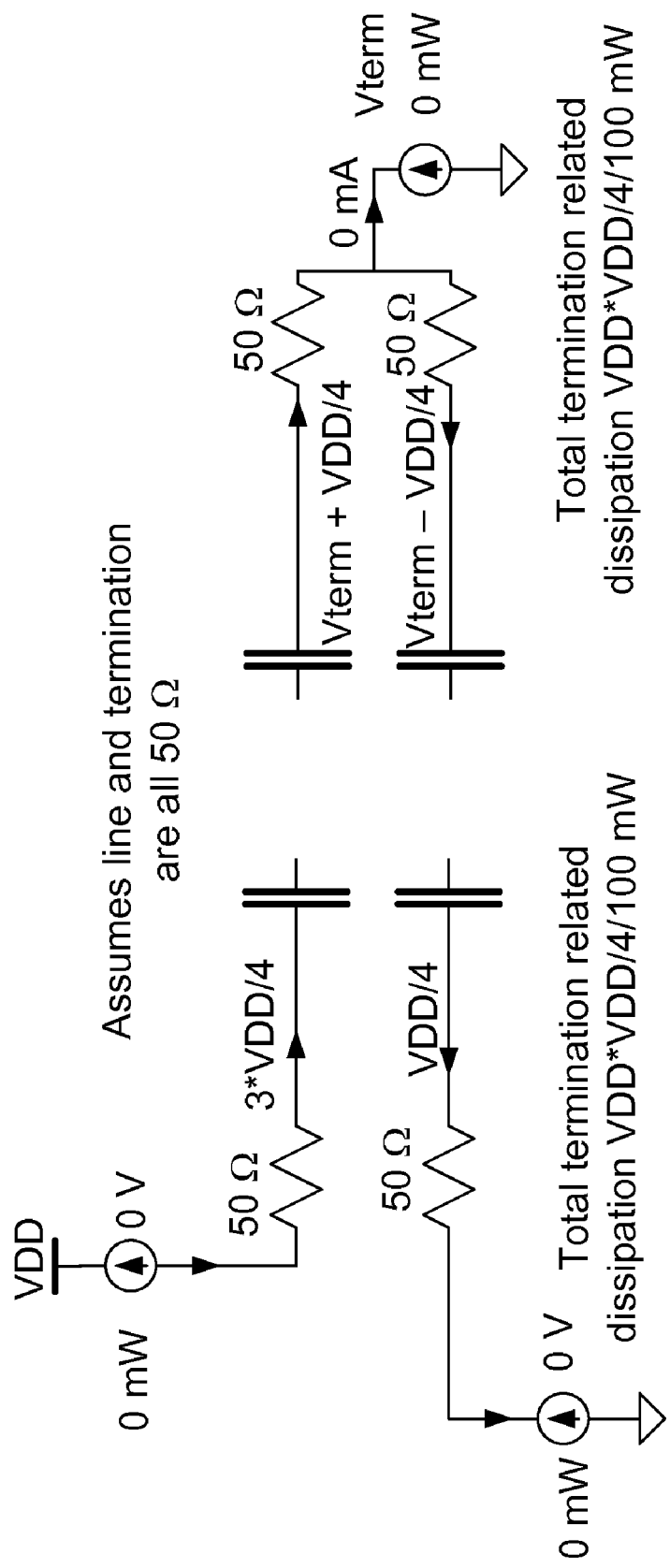
FIG. 13 illustrates a calculation of a typical termination power for CMOS voltage mode AC coupled interfaces.
Figure 14:
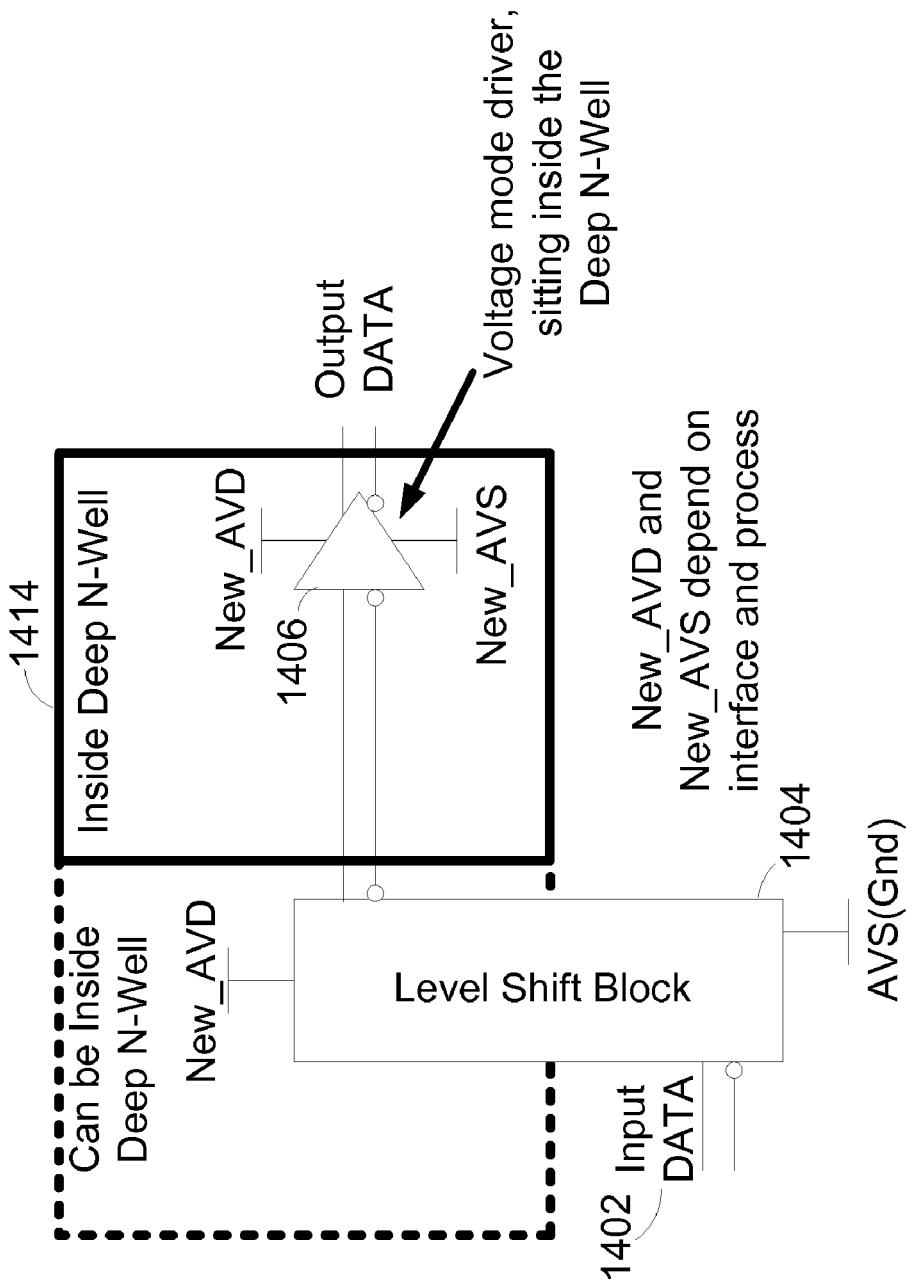
FIG. 14 illustrates a basic driver according to an embodiment of the invention.
Figure 15:
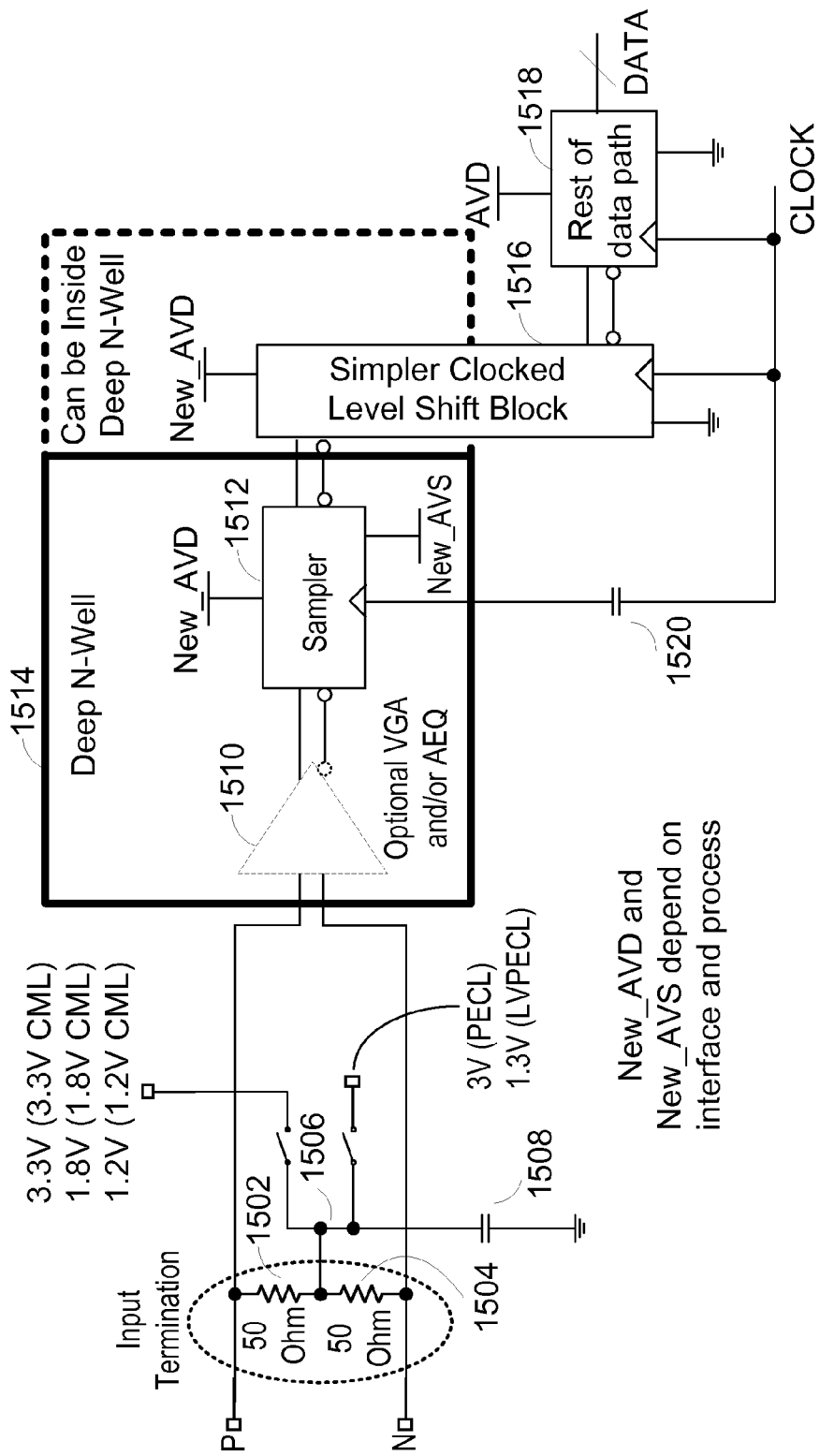
FIG. 15 illustrates a basic receiver according to an embodiment of the invention.

FIG. 14 illustrates a basic voltage-mode transmitter according to an embodiment of the invention, while FIG. 15 illustrates a basic receiver according to an embodiment of the invention.

With reference to FIG. 14, an input data signal 1402 can originate from another circuit within the CMOS integrated circuit and is provided as an input to a level shifter 1404. For example, the originating circuit can use standard CMOS voltage levels, such as 0.8 V to about 1.2 V for VDD, and ground for VSS for a chip from a modern, small geometry process. Optionally, analog voltage biases and ground can be separated from digital voltage biases and ground, even if the analog voltage bias and the digital voltage bias are at the same DC potential. The biases are separated so that analog circuits can have a cleaner source of power. In the illustrated embodiments, VDD and VSS indicate digital voltage biases, and AVD and AVS indicate analog voltage biases.

The level shifter 1404 adjusts the voltage levels for compatibility with the inputs of the driver 1406, which is biased by floating biases new_AVD and new_AVS, which are generated by voltage regulators. The particular voltage levels for new_AVD and new_AVS can vary depending on the interface to which the driver 1406 is intended to drive, such as ECL, PECL, LVPECL, CML, or the like. Voltage regulators will be discussed in greater detail later in connection with FIGS. 16A-16C. In one embodiment, the difference in voltage between new_AVD and new_AVS remains about the same as the difference in between voltage between VDD and VSS, such as, but not limited to, 0.8 volts to 1.2 volts. The DC voltage VDC can be, but is not limited to, VDD or AVD.

The level shifter 1404 can be implemented in a very wide variety of ways. For example, the level shifter 1404 can be implemented with conventional level shifters or with level shifters yet to be developed. Examples of conventional level shifters include, but are not limited to U.S. Pat. No. 7,205,820 to Yeung, et al, and U.S. Pat. No. 6,351,173 to Ovens, et al, the disclosures of which are hereby incorporated by reference herein.

In the context of a P-substrate, the driver 1406 should be embodied in a deep N-Well 1414 to protect against voltage breakdown. Retrograde P-wells can be fabricated within the deep N-Well 1414 for fabrication of P-channel devices.

Depending upon the particular configuration of the level shifter 1404, in certain embodiments, the level shifter 1404 can be an analog circuit, and thus can have exhibit relatively wide variability in operating characteristics. Preferably, the level shifter 1404 has relatively good performance characteristics as deficiencies in performance of the level shifter 1404 can have a large impact on the performance of the transmitter as a whole. Preferably, the level shifter 1404, the driver 1406, and the voltage regulators (not shown) of the transmitter are embodiment in the same integrated circuit.

FIG. 15 illustrates a basic receiver according to an embodiment of the invention. Resistors 1502, 1504 form an input termination for input nodes P, N, and are joined at a node 1506. Resistors 1502, 1504 are typically about 50 ohms, but other values may be used depending on the application. The node 1506 is biased by a voltage reference and is coupled to a capacitor 1508. The capacitor 1508 filters noise for the node 1506. The voltage reference should correspond to an appropriate voltage level to match the interface technology that is driving the inputs. In one embodiment, switches or jumpers or the like are used to select an appropriate voltage for the node 1506, which permits a single integrated circuit to be compatible even with DC coupling to a variety of interface standards, such as ECL, PECL, LVPECL, CML, or the like. In another embodiment, the node 1506 is coupled to an internal or to an external voltage source.

The signal path of the illustrated receiver can optionally have a variable gain amplifier (VGA) and/or analog equalizer (AEQ) 1510 followed by a sampling head or sampler 1512 within a deep N-well 1514, followed by a clocked level shifter 1516 that drives the rest of the data path 1518. In a transceiver configuration with both a transmitter and a receiver, the deep N-well 1414 and the deep N-well 1514 can be the same, but are typically separated for noise and layout reasons (proximity of the transmitter and receiver, etc.). The sampler 1512 can be a standard 2 samples per unit interval (UI) (one for data sampling and one for clock recovery using the well known Gardner method) sampler or can have more complex sampling (for example many more phases per UI or even analog to digital converters). For example, the sampler 1512 can receive a signal in continuous time as an input and generate discrete-time samples as an output. The components embodied within the deep N-Well 1514 are biased by floating biases new_AVD, new_AVS, which are generated by voltage regulators. The particular voltages selected for the biases or voltage references new_AVD, new_AVS can depend on the interface that is driving the differential input signal, such as ECL, PECL, LVPECL, CML, or the like. In one embodiment, at least a portion of the clocked level shifter 1516 is also inside the deep N-Well 1514 and biased by the floating biases. The circuits comprising the rest of the data path 1518 can be biased off of the normal VDD and ground that is provided to the integrated circuit. A clock signal can be level shifted such that level shifting for the clock signal for the sampler 1512 can be accomplished via AC coupling with a capacitor 1520. Accordingly, the illustrated clocked level shifter 1516 can be considered to be "simple," but if so desired, an active level shift block can be used to level shift the clock signal, which would make the clocked level shifter 1516 more complicated.

Figure 16C:
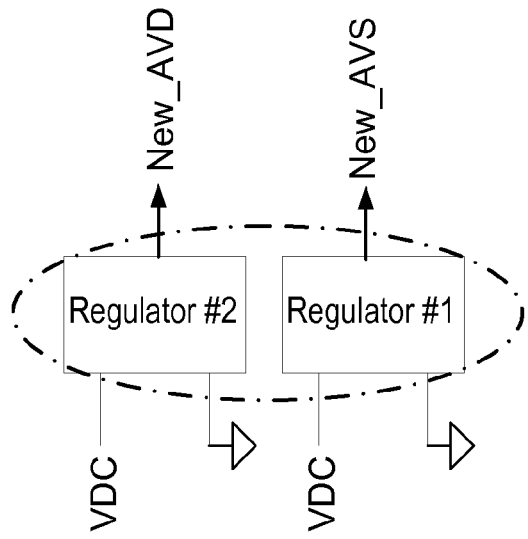
FIGS. 16A-16C illustrates a variety of possible power supply options.
Figure 16A:
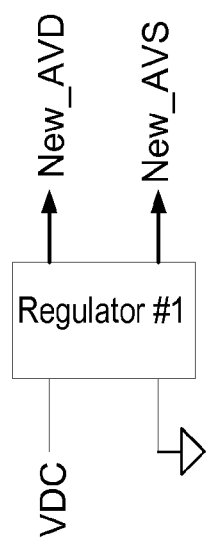
Figure 16B:
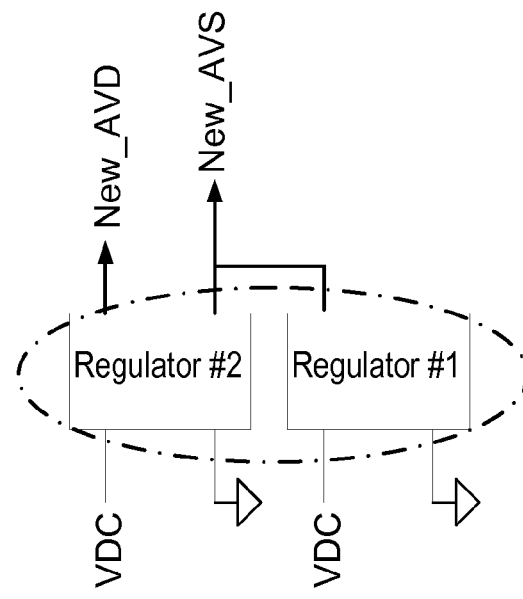

FIGS. 16A-16C illustrate a few power supply options. While any voltage regulator topology may be used, having a high efficiency regulator is important to low power consumption. Such topologies can include charge pumps. Various voltage regulators are well-known to those of ordinary skill in the art, and embodiments of the invention are compatible with conventional voltage regulators and those yet to be developed. Further it should be noted that the regulated power supplies may have to be adjusted through a feedback loop in applications that have a tight specification on output and/or common-mode levels. The output voltage New_AVD and New_AVS can be higher or lower than the input voltage, generically labeled VDC and ground, which can correspond to VDD and VSS, respectively, or to AVD and AVS, respectively. In one embodiment, the voltage regulators are built into the integrated circuit along with the drivers and/or receivers.

Advanced Embodiments

Figure 17:
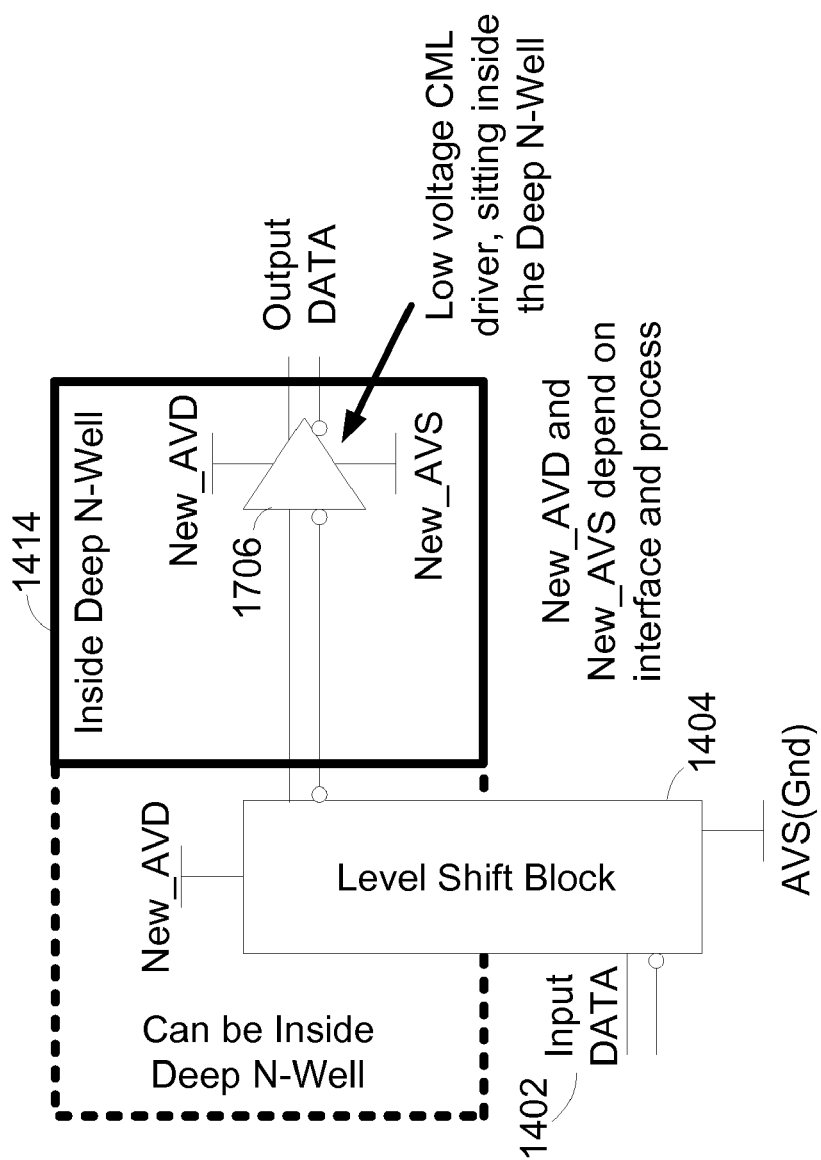
FIG. 17 illustrates another embodiment of a transmitter.

Other embodiments of the invention are shown in FIG. 17 to FIG. 20 for transmitters and FIG. 21 to FIG. 26 for receivers. FIG. 17 illustrates an embodiment in which a CML driver 1706 is used instead of the voltage-mode driver 1406 described earlier in connection with FIG. 14.

While the level shifter 1404 has been illustrated in the signal path just before the driver 1406 (FIG. 14) or the driver 1706 (FIG. 17), the level shifter 1404 can be disposed to an alternative location in the signal path for the transmitter to reduce the effects on the transmitter performance and/or to reduce the complexities of the level shifter 1404. See, for example, U.S. Pat. No. 6,351,173, to Ovens, et al.

Figure 18:
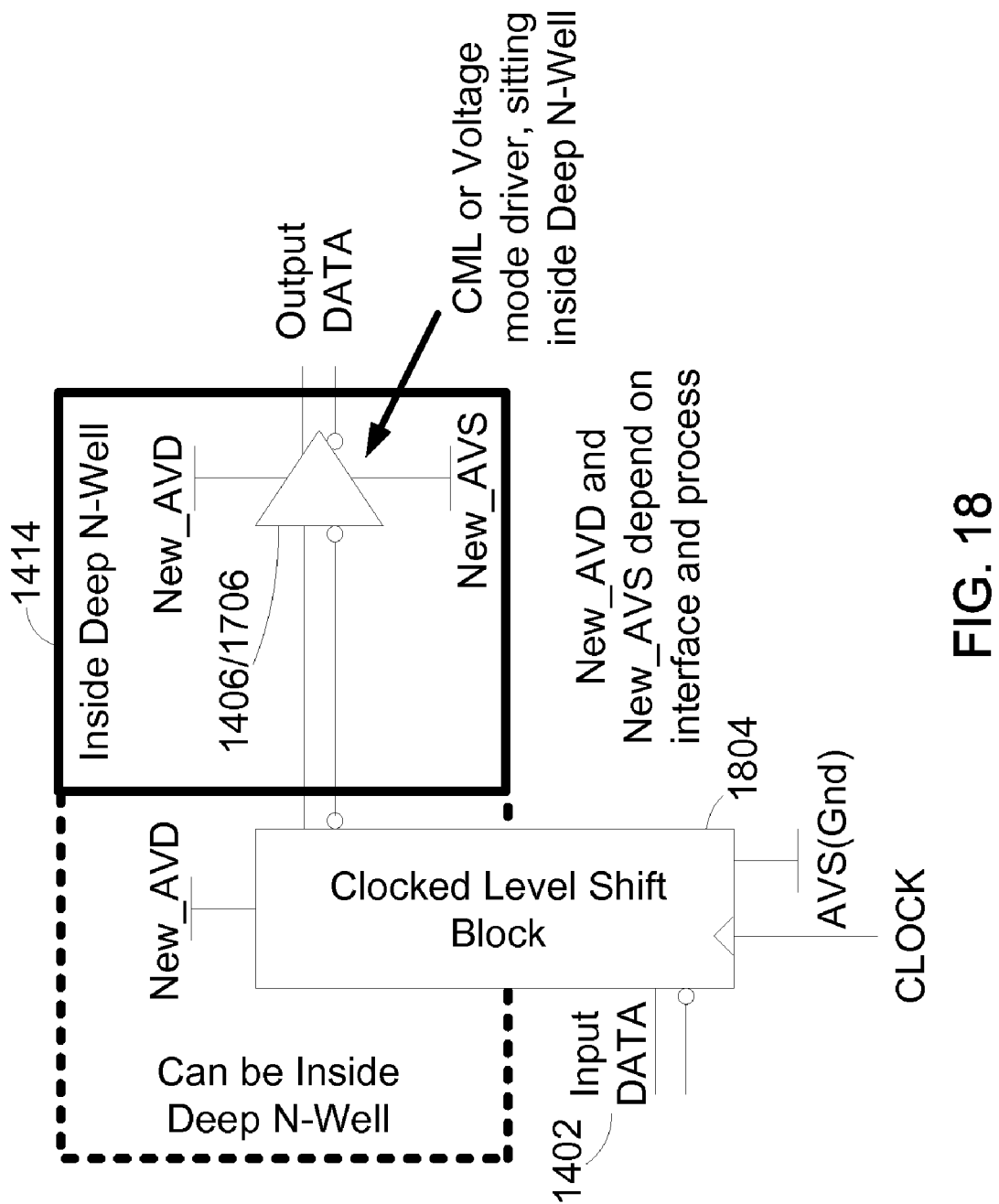
FIG. 18 illustrates another embodiment of a transmitter.
Figure 19:
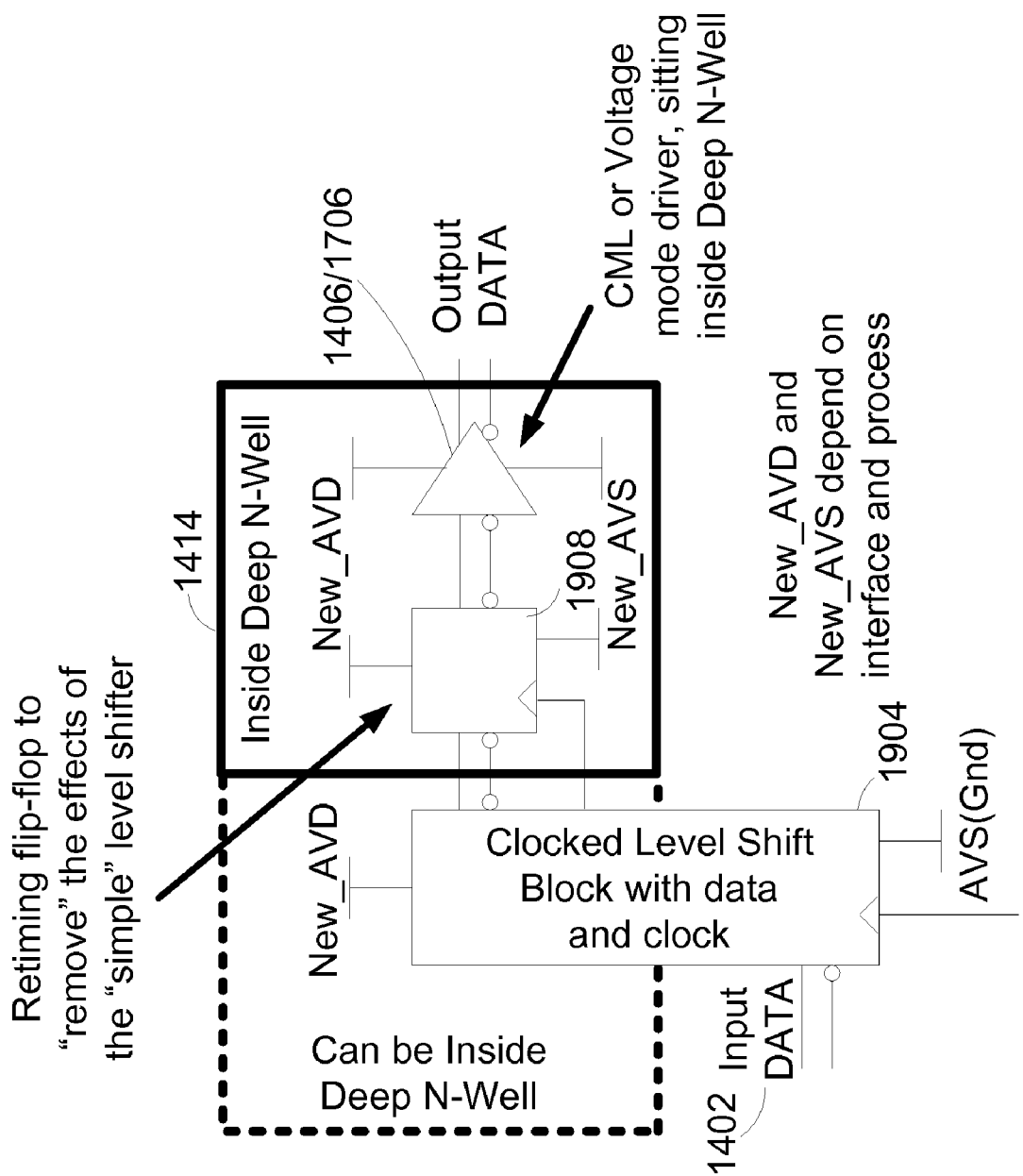
FIG. 19 illustrates another embodiment of a transmitter.
Figure 20:
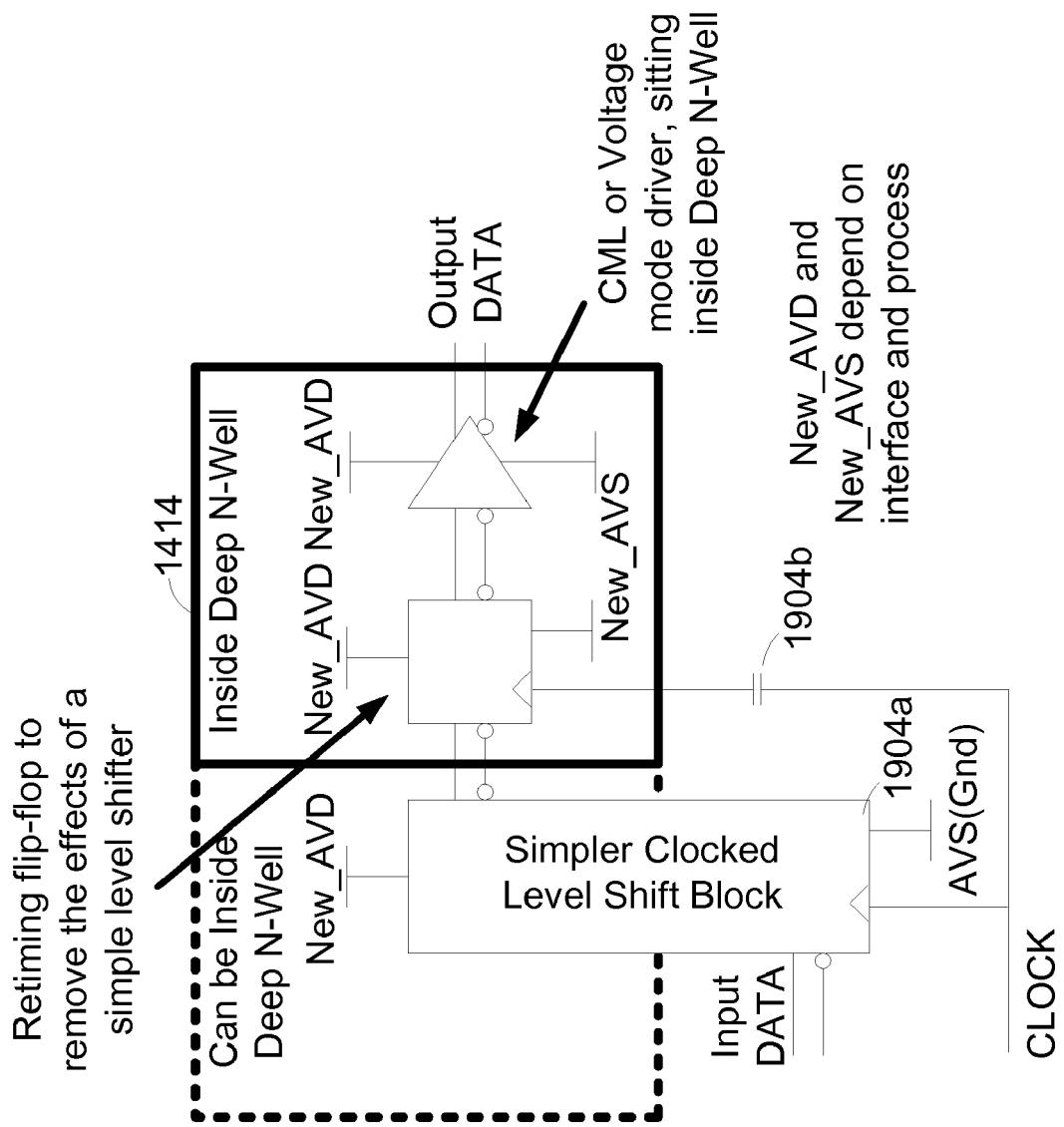
FIG. 20 illustrates another embodiment of a transmitter.

FIG. 18 illustrates a transmitter with a clocked level shifter 1804 instead of an active (or continuous-time) level shifter. A transmitter illustrated in FIG. 19 improves upon the output performance of the transmitter illustrated in FIG. 18 by introducing a sampling flip-flop 1908 following a level shifter 1904 in the signal path, wherein the sampling flip-flop 1908 removes the deleterious effects of the data portion of the level shifter 1904. For example, the level shifter 1904 can introduce jitter, which can be removed by retiming the signal carrying the data with the sampling flip-flop 1908. This allows the clock portion of the level shifter 1904 to be even "simpler" if desired, as illustrated in FIG. 20. As illustrated in FIG. 20, the level shifter 1904 can be implemented by a simpler level shifter 1904a for level shifting of data and a capacitor 1904b for level shifting of the clock signal.

FIGS. 21 to 26 illustrate various embodiments of receivers. The receiver described earlier in connection with FIG. 15 is drawn generically with the sampler 1512. The sampler 1512 can be implemented by a sample and hold (S/H) circuit or via a track and hold (T/H) circuit, by an analog to digital converter (ADC), by a combination of a S/H or T/H and ADC, and other configurations based on analog circuits, that will be readily determined by one of ordinary skill in the art.

Figure 21:
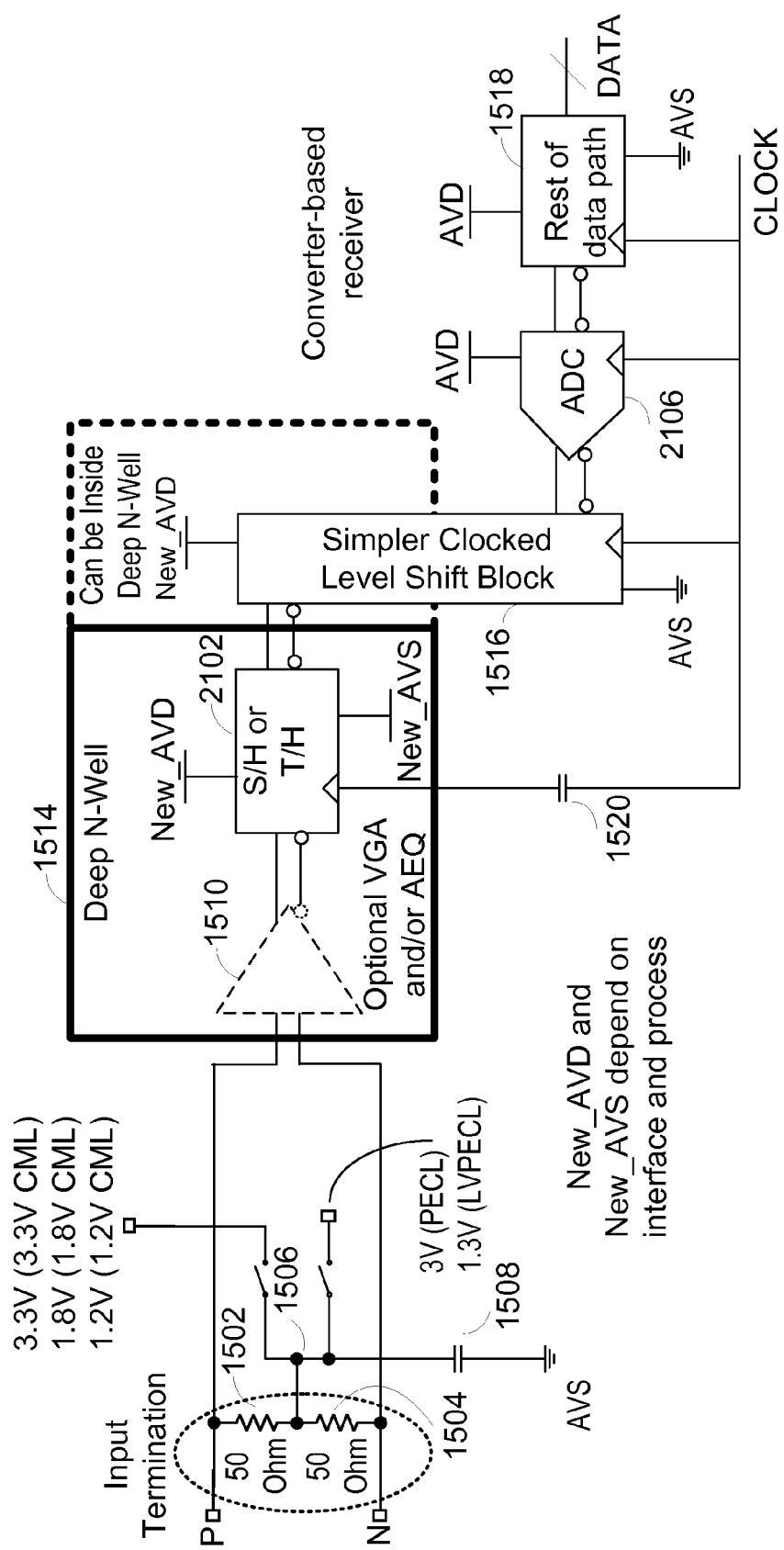
FIG. 21 illustrates another embodiment of a receiver.

FIG. 21 illustrates a receiver according to an embodiment of the invention. A differential input signal is provided as an input to the input nodes P, N, and to the termination components as described earlier in connection with FIG. 15. In the illustrated embodiment of FIG. 21, the sampler 1512 (FIG. 15) comprises a sample and hold (S/H) circuit or a track and hold (T/H) circuit 2102, which is embodied in the deep N-Well 1514. Level shifting for the clock signal for the S/H circuit or the T/H circuit 2102 can be provided by the capacitor 1520 as described earlier in connection with FIG. 15. Outputs of the S/H circuit or the T/H circuit 2102 are provided as inputs to a clocked level shifter 1516.

When at least one of the optional VGA and/or AEQ 1510 is present, the differential input signal is provided as an input to the optional VGA and/or AEQ 1510, and then outputs of the optional VGA and/or AEQ 1510 are provided as inputs to a sample and hold circuit or to a track and hold circuit 2102. Otherwise, the differential input signal can be provided as an input to the sample and hold circuit or track and hold circuit 2102. The output of the sample and hold circuit or track and hold circuit 2102 is coupled to the clocked level shifter 1516, which can optionally be embodied in the deep N-Well 1514. In the illustrated embodiment, outputs of the clocked level shifter 1516 are provided as inputs to an analog-to-digital converter (ADC) 2106. Outputs of the ADC 2106 can then be provided as inputs to the block 1518 representing the rest of the data path. In the embodiment illustrated in FIG. 21, the ADC 2106 and the rest of the data path are typically not in the deep N-Well 1514.

Figure 22:
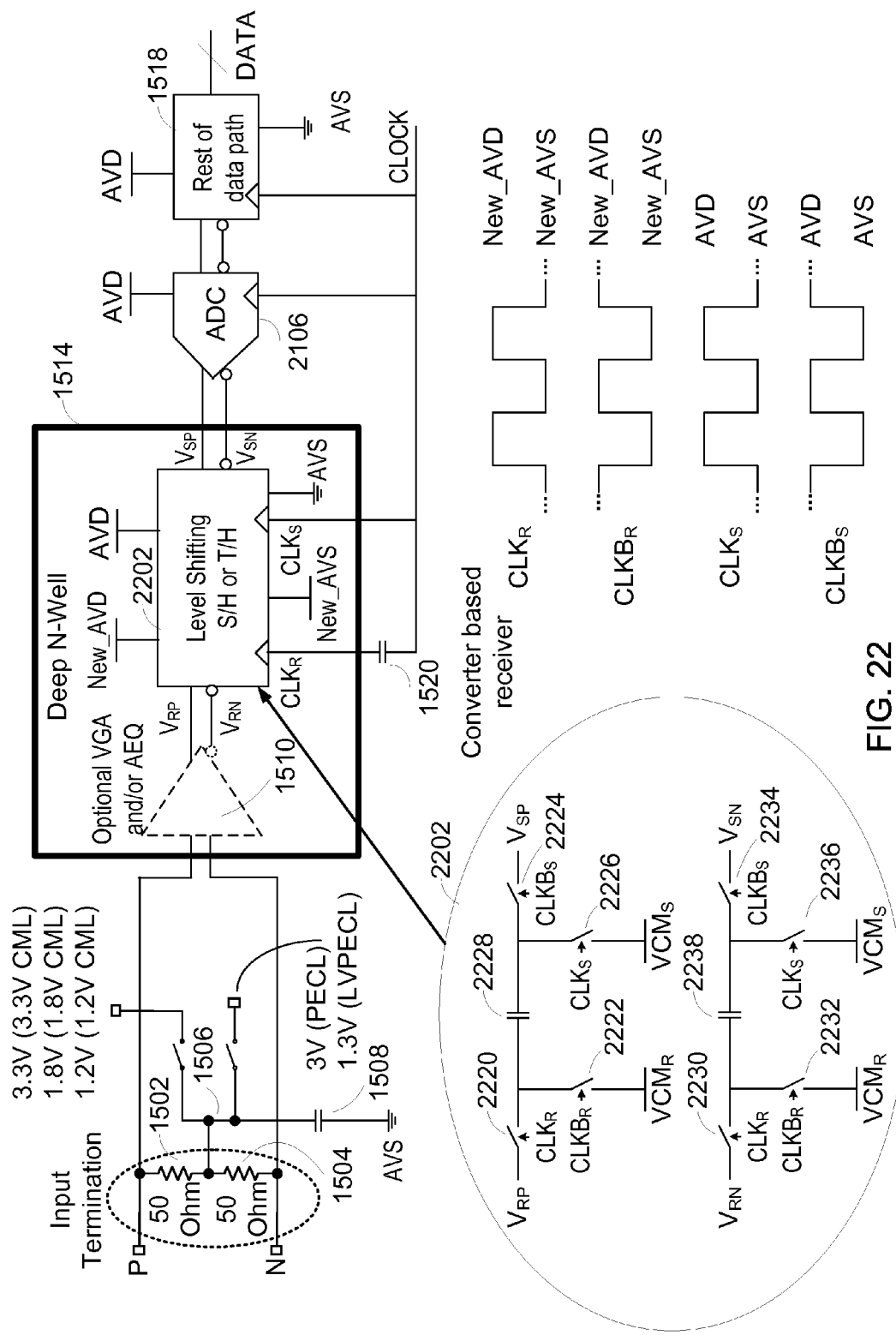
FIG. 22 illustrates another embodiment of a receiver.

FIG. 22 illustrates a receiver according to an embodiment of the invention. In FIG. 22, a level-shifting sample and hold circuit 2202 uses devices that can be formed in the deep N-Well 1514. One embodiment of the level-shifting sample and hold circuit 2202 is illustrated in more detail in a bubble to the lower left of FIG. 22. The switches 2220, 2222, 2224, 2226 for the positive input side (non-inverting) are controlled by clock signals $CLK_R$, $CLKB_R$, $CLK_S$, and $CLKB_S$, respectively. The switches 2230, 2232, 2234, 2236 for the negative input side (inverting) are controlled by clock signals $CLK_R$, $CLKB_R$, $CLK_S$, and $CLKB_S$, respectively. The illustrated level-shifting sample and hold circuit 2202 is inverting from input to output. The positive (non-inverting) side and the negative side (inverted) should be symmetric. $CLKB_R$ is an inverted version of $CLK_R$, and $CLKB_S$ is an inverted version of $CLK_S$. Illustrative waveforms for the clock signals $CLK_R$, $CLKB_R$, $CLK_S$, and $CLKB_S$ are drawn to the lower right of FIG. 22. In the example, a switch is closed when the switch's respective clock signal is high. The clock signals with subscript "R" are referenced to the higher voltages biases (New_AVD, New_AVS) of the Deep N-Well 1514, whereas the clock signals with subscript "S" can be referenced to the lower voltage biases (AVD, AVS) normally provided to the chip for analog operation.

The clock signals $CLK_S$, $CLKB_S$ preferably oscillate between AVS and AVD. The clock signals $CLK_R$, $CLKB_R$ preferably oscillate between New_AVS and New_AVD. In the illustrated embodiment, the clock signals $CLK_R$, $CLKB_R$ are AC coupled via the capacitor 1520 for level shifting. Other applicable voltage levels will be readily determined by one of ordinary skill in the art.

The voltage reference $VCM_R$ corresponds to the common-mode voltage at the input to the level-shifting sample and hold circuit 2202, for example, the receiver input. In one example, the voltage reference $VCM_R$ can be reused from the voltage at the node 1506. However, if the optional VGA and/or AEQ 1510 is present, then the voltage reference $VCM_R$ and the voltage at the node 1506 can vary. The voltage reference $VCM_S$ corresponds to the common-mode voltage at the output of level shifting sample and hold circuit 2202. For example, the voltage reference $VCM_S$ can correspond to an average level of the differential outputs $V_{SP}$, $V_{SN}$ and is generated with reference to a voltage divider, such as by buffering a voltage divider. Capacitors 2228, 2238 store charge for sampling or tracking. The size of the capacitors is not critical. Operation of the positive (non-inverting) side will be described. When the input voltage $V_{RP}$ is to be sampled, the switch 2220 is closed, the switch 2222 is opened, the switch 2224 is typically opened, and the switch 2226 is closed. One end of the switch 2226 is coupled to a common-mode voltage reference $VCM_S$ in the illustrated example. The voltage of the input $V_{RP}$ is then stored across the capacitor 2228. To hold the stored voltage and to read out the stored voltage, the switch 2220 is opened, the switch 2222 is closed, the switch 2224 is closed, and the switch 2226 is opened. It may be desirable to open the switch 2226 before closing the switch 2222. In the illustrated example, the switches are closed when the corresponding clock signal is high. Thus, the sampled output voltage $V_{SP}$ is the voltage reference $VCM_R$ minus the difference between the input voltage $V_{RP}$ and the common-mode reference voltage $VCM_S$ as expressed in Equation 1. Note that there is phase inversion in the illustrated embodiment.

$$V_{SP} = VCM_R (V_{RP} - VCM_S) \quad \text{(Eq. 1)}$$

Similarly, the sampled output voltage $V_{SN}$ is the voltage reference $VCM_R$ minus the difference between the input voltage $V_{RN}$ and the common-mode reference voltage $VCM_S$ as expressed in Equation 2.

$$V_{SN} = VCM_R - (V_{RN} - VCM_S) \quad \text{(Eq. 2)}$$

The $VCM_R$ to $VCM_S$ voltage offset provides a level shifting function. The switches 2220, 2222, 2224, 2226, 2230, 2232, 2234 can be either NMOS or PMOS or combinations of NMOS and PMOS depending on the voltages for a particular application.

Figure 23:
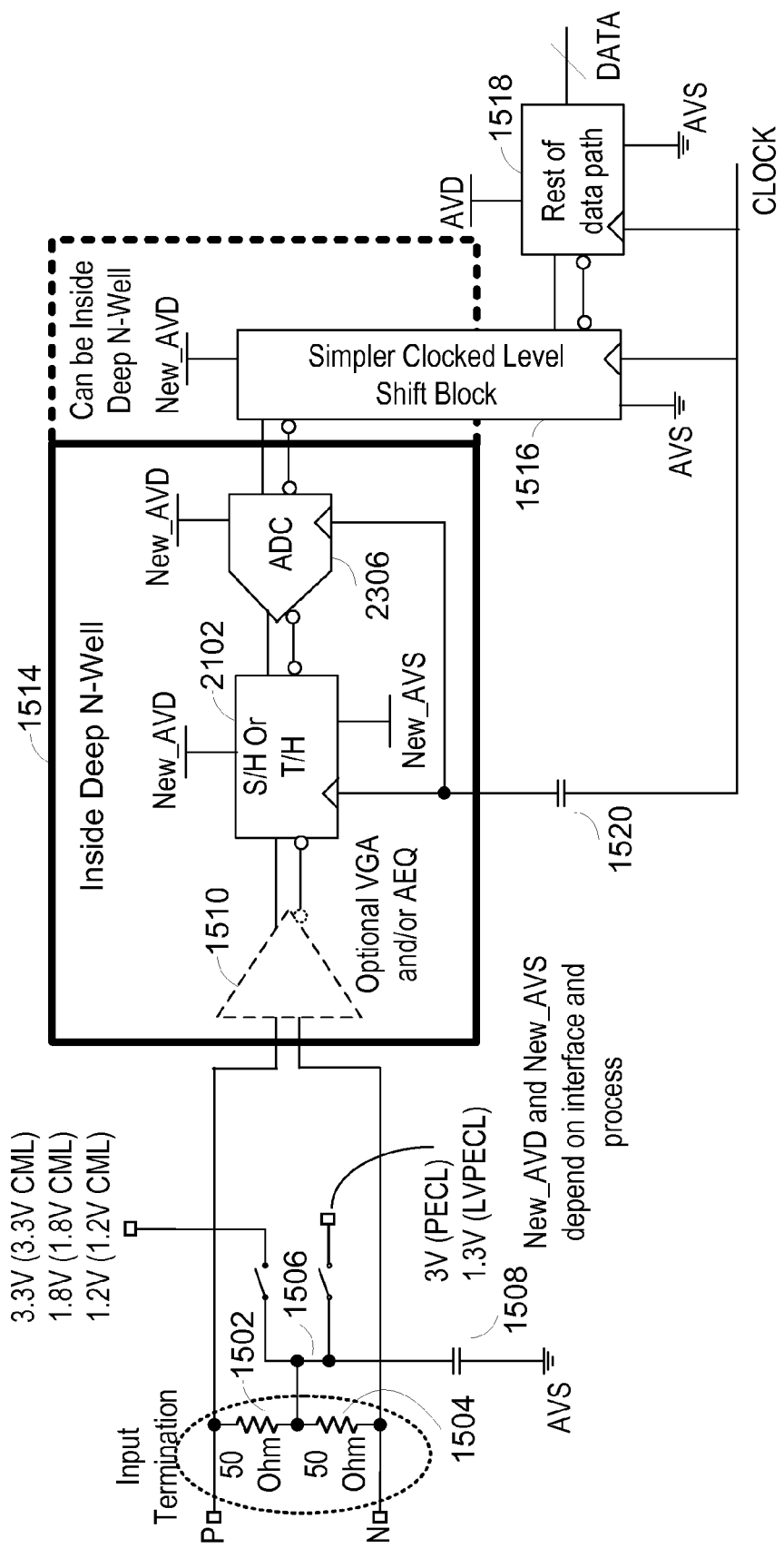
FIG. 23 illustrates another embodiment of a receiver.

FIG. 23 illustrates a receiver according to another embodiment of the invention. In contrast to the embodiment illustrated in FIG. 21 in which the ADC 2106 (FIG. 21) follows the clocked level shifter 1516 in the signal path, in the embodiment illustrated in FIG. 23, outputs of the S/H circuit or T/H circuit 2102 are provided as inputs to an ADC 2306, and the ADC 2306 is embodied within the deep N-Well 1514, rather than outside the deep N-Well 1514. Outputs of the ADC 2306 are provided as inputs to the clocked level shifter 1516, which can be inside, outside, or partially inside and outside of the deep N-Well 1514. Outputs of the clocked level shifter 1516 are provided as inputs to a block 1518 representing the rest of the data path.

Figure 24:
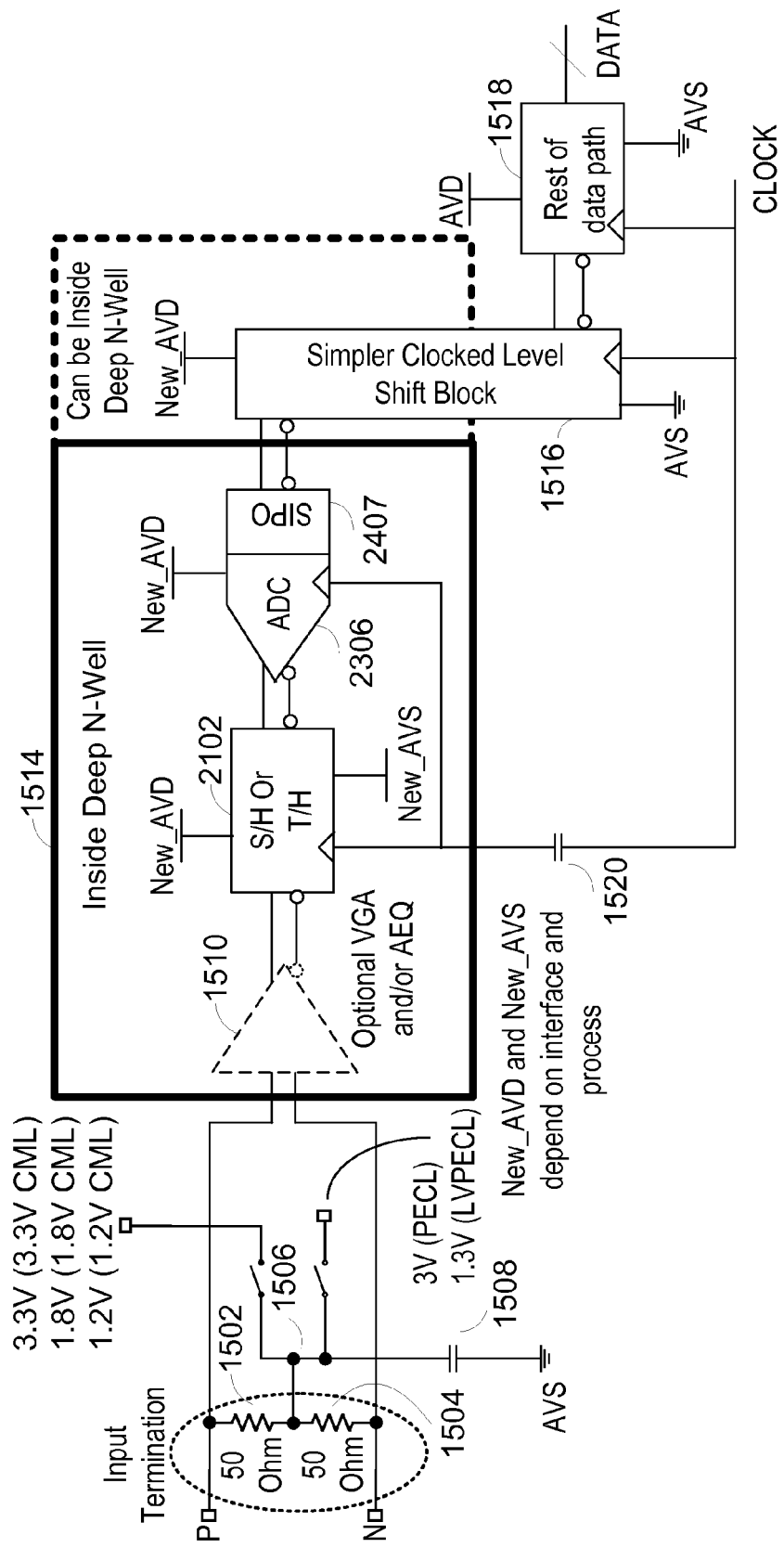
FIG. 24 illustrates another embodiment of a receiver.

FIG. 24 illustrates a receiver according to another embodiment of the invention. The embodiment illustrated in FIG. 24 is similar to that described earlier in connection with FIG. 23 with the addition of a serial in parallel out (SIPO) block 2407 in the signal path after the ADC 2306. With the increased number of paralleled outputs, the SIPO 2407 permits the clocked level shifter 1516 to operate at a slower rate.

Figure 25:
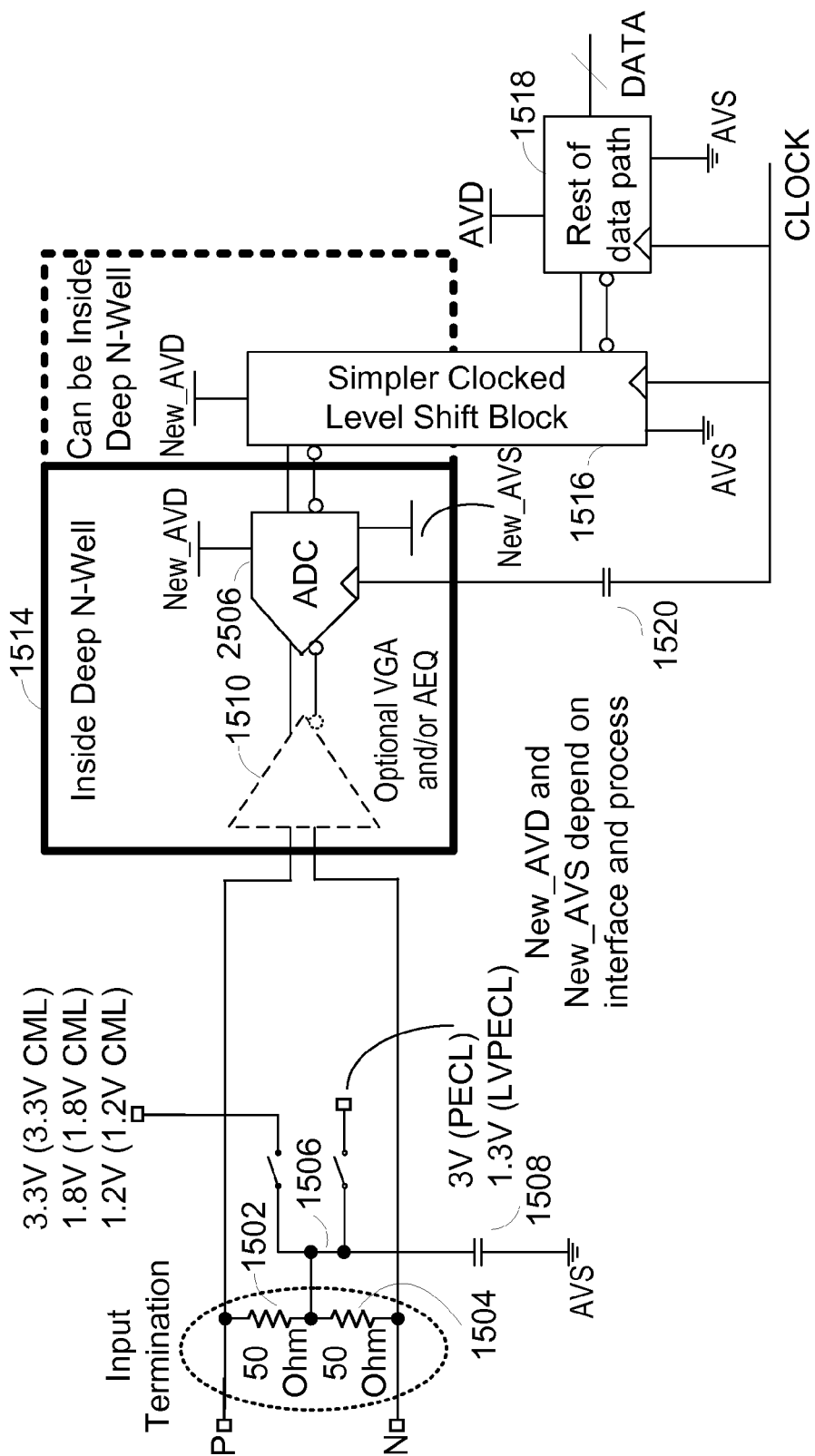
FIG. 25 illustrates another embodiment of a receiver.
Figure 26:
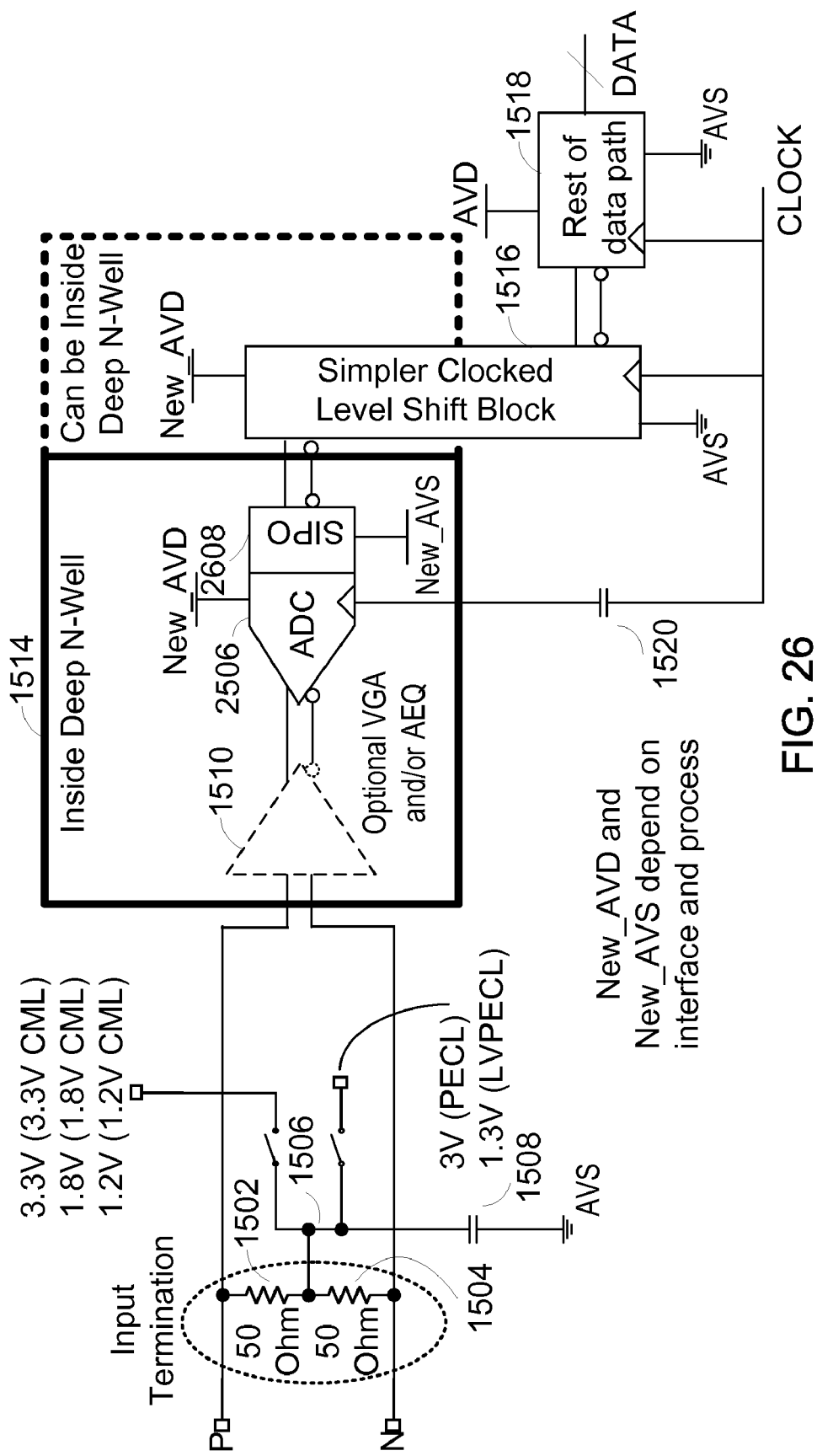
FIG. 26 illustrates another embodiment of a receiver.

FIGS. 25 and 26 illustrate embodiments similar to the embodiments described earlier in connection with FIGS. 23 and 24, respectively, except that the S/H circuit or T/H circuit 2102 are not present in the illustrated topology. FIG. 25 illustrates an embodiment in which analog-to-digital converter 2508 in the deep N-well 1514 (or deep P-well in an alternative embodiment) converts the input to digital without sampling or tracking, and FIG. 26 illustrates a SIPO circuit 2608 disposed in the signal path between the ADC 2506 and the clocked level shifter 1516.

The foregoing description and claims may refer to elements or features as being "connected" or "coupled" together. As used herein, unless expressly stated to the contrary, "connected" means that one element/feature is directly or indirectly connected to another element/feature, and not necessarily mechanically. Likewise, unless expressly stated to the contrary, "coupled" means that one element/feature is directly or indirectly coupled to another element/feature, and not necessarily mechanically. Thus, although the various schematics shown in the figures depict example arrangements of elements and components, additional intervening elements, devices, features, or components may be present in an actual embodiment (assuming that the functionality of the depicted circuits is not adversely affected).

Various embodiments have been described above. Although described with reference to these specific embodiments, the descriptions are intended to be illustrative and are not intended to be limiting. Various modifications and applications may occur to those skilled in the art.

What is claimed is:

1. An apparatus comprising:
   an integrated circuit having a P-type substrate with one or more deep N-wells or an N-type substrate with one or more deep P-wells, wherein the integrated circuit is coupled to at least a first voltage reference and a second voltage reference, the integrated circuit comprising;
   a plurality of circuits powered from the first voltage reference and the second voltage reference;
   a level-shift circuit configured to receive an input signal, wherein the input signal originates from a circuit from the plurality of circuits, wherein the level-shift circuit is configured to generate a level-shifted signal, wherein a level of the level-shifted signal is shifted from a level of the input signal; and
   a driver circuit for a transmitter embodied in the deep N-well or the deep P-well, wherein the driver circuit is configured to be powered from a third voltage reference and a fourth voltage reference different from the first voltage reference and the second voltage reference, wherein the third voltage reference and the fourth voltage reference are floating with respect to the first voltage reference and the second voltage reference, wherein the driver circuit has an input coupled directly or indirectly to the level-shifted signal of the level-shift circuit, and wherein the driver circuit is configured to generate an output signal as an output of the integrated circuit;

wherein the output of the integrated circuit is suitable for DC coupling to an input of a receiver.

2. The apparatus of claim 1, wherein the integrated circuit has the P-type substrate and the one or more deep N-wells and does not have the N-type substrate and the deep P-wells, wherein the plurality of circuits comprise CMOS circuits, and wherein the driver circuit is configured to generate the output signal such that the output signal is compatible with DC coupling to at least one of an emitter coupled logic, a positive emitter controlled logic, a low-voltage positive emitter controlled logic, or a current mode logic interface.

3. The apparatus of claim 1, wherein the driver circuit is configured to generate the output signal as a differential signal.

4. The apparatus of claim 1, wherein a voltage difference between the third voltage reference and the fourth voltage reference is about the same as a voltage difference between first voltage reference and the second voltage reference.

5. The apparatus of claim 1, further comprising a switching voltage regulator configured to generate the third voltage reference and the fourth voltage reference.

6. The apparatus of claim 5, wherein the switching voltage regulator is embodied in the integrated circuit.

7. The apparatus of claim 1, further comprising a sampling flip-flop embodied in the deep N-well or the deep P-well, wherein an input of the sampling flip-flop is operatively coupled to the level-shifted signal of the level shift circuit, wherein an output of the sampling flip-flop is provided to the input of the driver circuit, wherein a clock input of the sampling flip-flop is coupled to a level-shifted clock signal for retiming of data passing through the sampling flip-flop.

8. The apparatus of claim 7, further comprising a capacitor having a first terminal and a second terminal, wherein the first terminal is coupled to a circuit from the plurality of circuits to receive a clock signal, wherein the capacitor provides AC coupling for the clock signal to generate the level-shifted clock signal at the second terminal, wherein the second terminal is coupled to a clock input of the sampling flip-flop.

9. A method for transmitting data, the method comprising:
providing an integrated circuit having a P-type substrate with one or more deep N-wells or an N-type substrate with one or more deep P-wells, wherein the integrated circuit is coupled to at least a first voltage reference and a second voltage reference, wherein the integrated circuit comprises:
a plurality of circuits powered from the first voltage reference and the second voltage reference;
a level-shift circuit; and
a driver circuit for a transmitter embodied in the deep N-well or the deep P-well;
receiving an input signal in the level-shift circuit, wherein the input signal originates from a circuit from the plurality of circuits;
generating a level-shifted signal such that a level of the level-shifted signal is shifted from a level of the input signal, wherein the level-shifted signal is generated by the level-shift circuit;
operating the driver circuit via power from a third voltage reference and a fourth voltage reference different from the first voltage reference and the second voltage reference;
directly or indirectly receiving the level-shifted signal from the level-shift circuit in the driver circuit; and
generating an output signal as an output of the integrated circuit, wherein the output signal is generated by the driver circuit, and is suitable for DC coupling to an input of a receiver;
wherein a voltage difference between the third voltage reference and the fourth voltage reference is about the same as a voltage difference between first voltage reference and the second voltage reference.

10. The method of claim 9, wherein the integrated circuit has the P-type substrate and the one or more deep N-wells and does not have the N-type substrate and the deep P-wells, wherein the plurality of circuits comprise CMOS circuits, and wherein the driver circuit is configured to generate the output signal such that the output signal is compatible with DC coupling to at least one of an emitter coupled logic, a positive emitter controlled logic, a low-voltage positive emitter controlled logic, or a current mode logic interface.

11. The method of claim 9, wherein the driver circuit is configured to generate the output signal as a differential signal.

12. A method for transmitting data, the method comprising:
providing an integrated circuit having a P-type substrate with one or more deep N-wells or an N-type substrate with one or more deep P-wells, wherein the integrated circuit is coupled to at least a first voltage reference and a second voltage reference, wherein the integrated circuit comprises:
a plurality of circuits powered from the first voltage reference and the second voltage reference;
a level-shift circuit; and
a driver circuit for a transmitter embodied in the deep N-well or the deep P-well;
receiving an input signal in the level-shift circuit, wherein the input signal originates from a circuit from the plurality of circuits;
generating a level-shifted signal such that a level of the level-shifted signal is shifted from a level of the input signal, wherein the level-shifted signal is generated by the level-shift circuit;
operating the driver circuit via power from a third voltage reference and a fourth voltage reference different from the first voltage reference and the second voltage reference;
directly or indirectly receiving the level-shifted signal from the level-shift circuit in the driver circuit;
generating an output signal as an output of the integrated circuit, wherein the output signal is generated by the driver circuit, and is suitable for DC coupling to an input of a receiver;
providing a switching voltage regulator; and
generating the third voltage reference and the fourth voltage reference with the switching voltage regulator.

13. The method of claim 12, wherein the switching voltage regulator is embodied in the integrated circuit.

14. A method for transmitting data, the method comprising:
providing an integrated circuit having a P-type substrate with one or more deep N-wells or an N-type substrate with one or more deep P-wells, wherein the integrated circuit is coupled to at least a first voltage reference and a second voltage reference, wherein the integrated circuit comprises:
- a plurality of circuits powered from the first voltage reference and the second voltage reference;
- a level-shift circuit; and
- a driver circuit for a transmitter embodied in the deep N-well or the deep P-well;

receiving an input signal in the level-shift circuit, wherein the input signal originates from a circuit from the plurality of circuits;

generating a level-shifted signal such that a level of the level-shifted signal is shifted from a level of the input signal, wherein the level-shifted signal is generated by the level-shift circuit;

operating the driver circuit via power from a third voltage reference and a fourth voltage reference different from the first voltage reference and the second voltage reference;

directly or indirectly receiving the level-shifted signal from the level-shift circuit in the driver circuit;

generating an output signal as an output of the integrated circuit, wherein the output signal is generated by the driver circuit, and is suitable for DC coupling to an input of a receiver;

providing a sampling flip-flop embodied in the deep N-well or the deep P-well, wherein directly or indirectly receiving the level-shifted signal further comprises:
- coupling an input of the sampling flip-flop to the level-shifted signal of the level shift circuit;
- providing an output of the sampling flip-flop to the input of the driver circuit; and
- operating the sampling flip-flop via a level-shifted clock signal for retiming of data passing through the sampling flip-flop.

15. The method of claim 14, further comprising:
- providing a capacitor having a first terminal and a second terminal;
- coupling the first terminal to a circuit from the plurality of circuits to receive a clock signal;
- AC coupling the clock signal to generate the level-shifted clock signal at the second terminal; and
- coupling the second terminal to a clock input of the sampling flip-flop.

16. An apparatus for transmitting data, the apparatus comprising:
- an integrated circuit having a P-type substrate with one or more deep N-wells or an N-type substrate with one or more deep P-wells, wherein the integrated circuit is coupled to at least a first voltage reference and a second voltage reference, wherein the integrated circuit comprises:
  - a plurality of circuits powered from the first voltage reference and the second voltage reference;
  - means for level shifting an input signal to generate a level-shifted signal such that a level of the level-shifted signal is shifted from a level of the input signal, wherein the input signal originates from a circuit from the plurality of circuits;
  - means for generating an output signal as an output of a transmitter of the integrated circuit, wherein the generating means is embodied in the deep N-well or the deep P-well and is configured to be powered from a third voltage reference and a fourth voltage reference different from the first voltage reference and the second voltage reference, wherein the generating means has an input coupled directly or indirectly to the level-shifted signal of the level shifting means;
  - wherein the output of the integrated circuit is suitable for DC coupling to an input of a receiver;
  - wherein a voltage difference between the third voltage reference and the fourth voltage reference is about the same as a voltage difference between first voltage reference and the second voltage reference.

17. An apparatus comprising:
- an integrated circuit having a P-type substrate with one or more deep N-wells or an N-type substrate with one or more deep P-wells, wherein the integrated circuit is coupled to at least a first voltage reference and a second voltage reference, the integrated circuit comprising;
  - a plurality of circuits powered from the first voltage reference and the second voltage reference;
  - a sampler embodied in the deep N-well or the deep P-well, wherein the sampler is configured to be powered from a third voltage reference and a fourth voltage reference different from and floating with respect to the first voltage reference and the second voltage reference, wherein the sampler has an input coupled directly or indirectly to an input signal that is provided as an input to the integrated circuit, wherein the sampler is configured to generate discrete-time samples as an output of the sampler; and
  - a level-shift circuit configured to generate a level-shifted signal and to provide the level-shifted signal to a circuit from the plurality of circuits, wherein an input of the level-shift circuit is coupled directly or indirectly to the output of the sampler, wherein a level of the level-shifted signal is shifted from a level of the input of the level-shift circuit;
  - wherein the input of the integrated circuit is compatible with DC coupling to an output signal from a transmitter.

18. The apparatus of claim 17, wherein the integrated circuit has the P-type substrate and one or more deep N-wells and does not have the N-type substrate and deep P-wells, wherein the plurality of circuits comprise CMOS circuits, wherein an interface for the transmitter is selected from an emitter coupled logic, a positive emitter controlled logic, a low-voltage positive emitter controlled logic, or a current mode logic interface.

19. The apparatus of claim 17, wherein a voltage difference between the third voltage reference and the fourth voltage reference is about the same as a voltage difference between first voltage reference and the second voltage reference, and wherein voltages of the third voltage reference and the fourth voltage reference are selected for a particular interface.

20. The apparatus of claim 17, further comprising a switching voltage regulator configured to generate the third voltage reference and the fourth voltage reference.

21. The apparatus of claim 20, wherein the switching voltage regulator is embodied in the integrated circuit.

22. The apparatus of claim 17, further comprising a capacitor having a first terminal and a second terminal, wherein the first terminal is coupled to a circuit from the plurality of circuits to receive a clock signal, wherein the capacitor provides AC coupling for the clock signal to generate the level-shifted clock signal at the second terminal, wherein the second terminal is coupled to a clock input of the sampler.

23. The apparatus of claim 17, further comprising a variable gain amplifier embodied in the deep N-well or the deep P-well, wherein an input of the variable gain amplifier is operatively coupled to the input signal, wherein an output of the variable gain amplifier is operatively coupled to the input of the sampler.

24. The apparatus of claim 17, further comprising an analog equalizer embodied in the deep N-well or the deep P-well, wherein an input of the analog equalizer is operatively coupled to the input signal, wherein an output of the analog equalizer is operatively coupled to the input of the sampler.

25. The apparatus of claim 17, further comprising a variable gain amplifier and an analog equalizer embodied in the deep N-well or the deep P-well, wherein an input of one of the variable gain amplifier or the analog equalizer is operatively coupled to the input signal, wherein an output of the one of the variable gain amplifier or the analog equalizer is operatively coupled to an input of the other of the variable gain amplifier or the analog equalizer, and wherein an output of the other of the variable gain amplifier or the analog equalizer is operatively coupled to the input of the sampler.

26. The apparatus of claim 17, wherein the sampler comprises a sample and hold circuit or a track and hold circuit.

27. The apparatus of claim 17, further comprising an analog-to-digital converter (ADC) embodied in the deep N-well or the deep P-well, wherein an input of the ADC is operatively coupled to an output of the sampler, wherein an output of the ADC is operatively coupled directly or indirectly to the input of the level-shift circuit.

28. The apparatus of claim 27, further comprising a serial in parallel out (SIPO) circuit embodied in the deep N-well or the deep P-well, wherein an input of the SIPO circuit is operatively coupled to an output of the ADC, wherein an output of the SIPO circuit is operatively coupled to the input of the level-shift circuit.

29. The apparatus of claim 17, wherein the sampler comprises an analog-to-digital converter (ADC).

30. The apparatus of claim 29, further comprising a serial in parallel out (SIPO) circuit embodied in the deep N-well or the deep P-well, wherein an input of the SIPO is operatively coupled to an output of the ADC, wherein an output of the SIPO is operatively coupled to the input of the level-shift circuit.

31. A method for receiving data, the method comprising:
providing an integrated circuit having a P-type substrate with one or more deep N-wells or an N-type substrate with one or more deep P-wells, wherein the integrated circuit is coupled to at least a first voltage reference and a second voltage reference, wherein the integrated circuit comprises:
a plurality of circuits powered from the first voltage reference and the second voltage reference;
a sampler embodied in the deep N-well or the deep P-well; and
a level-shift circuit;
operating the sampler via power from a third voltage reference and a fourth voltage reference different from and floating with respect to the first voltage reference and the second voltage reference, wherein the sampler has an input coupled directly or indirectly to an input signal that is provided as an input to the integrated circuit;
generating discrete-time samples as an output of the sampler;
coupling an input of the level-shift circuit directly or indirectly to the output of the sampler;
generating a level-shifted signal such that a level of the level-shifted signal is shifted from a level of the input of the level-shift circuit;
providing the level-shifted signal to a circuit from the plurality of circuits;

wherein the input of the integrated circuit is compatible with DC coupling to an output of a transmitter.

32. The method of claim 31, wherein the integrated circuit has the P-type substrate and one or more deep N-wells and does not have the N-type substrate and deep P-wells, wherein the plurality of circuits comprise CMOS circuits, wherein an interface for the transmitter is selected from an emitter coupled logic, a positive emitter controlled logic, a low-voltage positive emitter controlled logic, or a current mode logic interface.

33. The method of claim 31, wherein a voltage difference between the third voltage reference and the fourth voltage reference is about the same as a voltage difference between first voltage reference and the second voltage reference, and wherein voltages of the third voltage reference and the fourth voltage reference are selected for a particular interface.

34. The method of claim 31, further comprising:
providing a switching voltage regulator; and
generating the third voltage reference and the fourth voltage reference with the switching voltage regulator.

35. The method of claim 34, wherein the switching voltage regulator is embodied in the integrated circuit.

36. The method of claim 31, further comprising:
providing a capacitor having a first terminal and a second terminal;
coupling the first terminal to a circuit from the plurality of circuits to receive a clock signal;
AC coupling the clock signal to generate the level-shifted clock signal at the second terminal; and
coupling the second terminal to a clock input of the sampler.

37. The method of claim 31, further comprising:
providing a variable gain amplifier embodied in the deep N-well or the deep P-well;
operatively coupling an input of the variable gain amplifier to the input signal; and
operatively coupling an output of the variable gain amplifier to the input of the sampler.

38. The method of claim 31, further comprising:
providing an analog equalizer embodied in the deep N-well or the deep P-well;
operatively coupling an input of the analog equalizer to the input signal; and
operatively coupling an output of the analog equalizer to the input of the sampler.

39. The method of claim 31, further comprising:
providing a variable gain amplifier and an analog equalizer embodied in the deep N-well or the deep P-well;
operatively coupling an input of one of the variable gain amplifier or the analog equalizer to the input signal;
operatively coupling an output of the one of the variable gain amplifier or the analog equalizer to an input of the other of the variable gain amplifier or the analog equalizer; and
operatively coupling an output of the other of the variable gain amplifier or the analog equalizer to the input of the sampler.

40. The method of claim 31, wherein generating discrete-time samples comprises sampling and holding or tracking and holding.

41. The method of claim 31, further comprising:
providing an analog-to-digital converter (ADC) embodied in the deep N-well or the deep P-well;
operatively coupling an input of the ADC to an output of the sampler; and
operatively coupling an output of the ADC directly or indirectly to the input of the level-shift circuit.

42. The method of claim 41, further comprising:
providing a serial in parallel out (SIPO) circuit embodied in the deep N-well or the deep P-well;
operatively coupling an input of the SIPO circuit to an output of the ADC; and
operatively coupling an output of the SIPO circuit to the input of the level-shift circuit.

43. The method of claim 31, wherein generating discrete-time samples comprises performing analog-to-digital conversions.

44. The method of claim 43, further comprising:
providing a serial in parallel out (SIPO) circuit embodied in the deep N-well or the deep P-well;
operatively coupling an input of the SIPO circuit to an output of the ADC; and
operatively coupling an output of the SIPO circuit to the input of the level-shift circuit.

45. An apparatus for receiving data, the apparatus comprising:
an integrated circuit having a P-type substrate with one or more deep N-wells or an N-type substrate with one or more deep P-wells, wherein the integrated circuit is coupled to at least a first voltage reference and a second voltage reference, the integrated circuit comprising;
a plurality of circuits powered from the first voltage reference and the second voltage reference;
means for sampling an input signal that is provided as an input to the integrated circuit, wherein the sampling means is configured to generate discrete-time samples, wherein the sampling means is configured to be powered from a third voltage reference and a fourth voltage reference different from and floating with respect to the first voltage reference and the second voltage reference, wherein the sampling means is embodied in the deep N-well or the deep P-well; and
means for level shifting configured to generate a level-shifted signal and to provide the level-shifted signal to a circuit from the plurality of circuits, wherein an input of the level shifting means is coupled directly or indirectly to the output of the sampling means, wherein a level of the level-shifted signal is shifted from a level of the input of the level shifting means;
wherein the input of the integrated circuit is compatible with DC coupling to an output signal from a transmitter.

46. An apparatus comprising:
an integrated circuit having a P-type substrate with one or more deep N-wells or an N-type substrate with one or more deep P-wells, wherein the integrated circuit is coupled to at least a first voltage reference and a second voltage reference, the integrated circuit comprising;
a plurality of circuits powered from the first voltage reference and the second voltage reference;
a level-shifting sample and hold circuit embodied in the deep N-well or the deep P-well, wherein the level-shifting sample and hold circuit is configured to be powered from a third voltage reference and a fourth voltage reference different from and floating with respect to the first voltage reference and the second voltage reference, wherein the level-shifting sample and hold circuit has an input coupled directly or indirectly to an input signal that is provided as an input to the integrated circuit, wherein the level-shifting sample and hold circuit is configured to generate a level-shifted signal comprising discrete-time samples as an output, and to provide the level-shifted signal to a circuit from the plurality of circuits, wherein a level of the level-shifted signal is shifted from a level of the input signal;
wherein the input of the integrated circuit is compatible with DC coupling to an output signal from a transmitter.

47. The method of claim 46, wherein the integrated circuit has the P-type substrate and one or more deep N-wells and does not have the N-type substrate and deep P-wells, wherein the plurality of circuits comprise CMOS circuits, and wherein an interface for the transmitter is selected from an emitter coupled logic, a positive emitter controlled logic, a low-voltage positive emitter controlled logic, or a current mode logic interface.

48. The apparatus of claim 46, wherein at least a portion of the level-shifting sample and hold circuit comprises:
a storage capacitor having a first terminal and a second terminal; and
a first switch having a first terminal and a second terminal, a second switch having a first terminal and a second terminal, a third switch having a first terminal and a second terminal, and a fourth switch having a first terminal and a second terminal;
wherein the first terminal of the first switch is coupled directly or indirectly to a non-inverted portion or an inverted portion of the input signal, wherein the second terminal of the first switch is coupled to a first node;
wherein the first terminal of the second switch is coupled to the first node, wherein the second terminal of the second switch is coupled to an input common-mode voltage;
wherein the first terminal of the storage capacitor is coupled to the first node, wherein the second terminal of the storage capacitor is coupled to a second node;
wherein the first terminal of the third switch is coupled to the second node, wherein the second terminal of the third switch is directly or indirectly coupled to the circuit from the plurality of circuits;
wherein the first terminal of the fourth switch is coupled to the second node, wherein the second terminal of the fourth switch is coupled to an output common-mode voltage;
wherein the first switch and the fourth switch are closed and the second switch and the third switch are open in a first portion of a clock period such that the storage capacitor stores a voltage as charge from the input;
wherein the first switch and the fourth switch are open and the second switch and the third switch are closed in a second portion of the clock period such that the storage capacitor provides the stored voltage as an output of the level-shifting sample and hold circuit.

49. The apparatus of claim 46, wherein the circuit from the plurality of circuits comprises an analog-to-digital converter.

50. A method for receiving data, the method comprising:
providing an integrated circuit having a P-type substrate with one or more deep N-wells or an N-type substrate with one or more deep P-wells, wherein the integrated circuit is coupled to at least a first voltage reference and a second voltage reference, wherein the integrated circuit comprises:
a plurality of circuits powered from the first voltage reference and the second voltage reference; and
a level-shifting sample and hold circuit embodied in the deep N-well or the deep P-well;
operating the level-shifting sample and hold circuit via power from a third voltage reference and a fourth voltage reference different from and floating with respect to the first voltage reference and the second voltage reference, wherein the level-shifting sample and hold circuit has an input coupled directly or indirectly to an input signal that is provided as an input to the integrated circuit;

generating a level-shifted signal comprising discrete-time samples as an output of the level-shifting sample and hold circuit such that a level of the level-shifted signal is shifted from a level of the input of the level-shift circuit;

providing the level-shifted signal to a circuit from the plurality of circuits;

wherein the input of the integrated circuit is compatible with DC coupling to an output of a transmitter.

51. The method of claim 50, wherein the integrated circuit has the P-type substrate and one or more deep N-wells and does not have the N-type substrate and deep P-wells, wherein the plurality of circuits comprise CMOS circuits, and wherein an interface for the transmitter is selected from an emitter coupled logic, a positive emitter controlled logic, a low-voltage positive emitter controlled logic, or a current mode logic interface.

52. The method of claim 50, further comprising:

providing a storage capacitor having a first terminal and a second terminal;

providing a first switch having a first terminal and a second terminal, a second switch having a first terminal and a second terminal, a third switch having a first terminal and a second terminal, and a fourth switch having a first terminal and a second terminal;

coupling the first terminal of the first switch directly or indirectly to a non-inverted portion or an inverted portion of the input signal;

coupling the second terminal of the first switch to a first node;

coupling the first terminal of the second switch to the first node;

coupling the second terminal of the second switch to an input common-mode voltage;

coupling the first terminal of the storage capacitor to the first node;

coupling the second terminal of the storage capacitor to a second node;

coupling the first terminal of the third switch to the second node;

coupling the second terminal of the third switch directly or indirectly to a non-inverted input or an inverted input of an analog-to-digital converter;

coupling the first terminal of the fourth switch to an output common-mode voltage; and coupling the second terminal of the fourth switch to the second voltage reference;

storing a voltage from the input as charge in the storage capacitor during a first portion of a sampling period by closing the first switch and the fourth switch and opening the second switch and the third switch; and providing the stored voltage from the storage capacitor as an output of the level-shifting sample and hold circuit during a second portion of the sampling period by closing the first switch and the fourth switch and opening the second switch and the third switch.

53. The method of claim 50, wherein the circuit from the plurality of circuits comprises an analog-to-digital converter.

54. An apparatus for receiving data, the apparatus comprising:

an integrated circuit having a P-type substrate with one or more deep N-wells or an N-type substrate with one or more deep P-wells, wherein the integrated circuit is coupled to at least a first voltage reference and a second voltage reference, the integrated circuit comprising;

a plurality of circuits powered from the first voltage reference and the second voltage reference;

means for level-shifted sampling an input signal that is provided as an input to the integrated circuit to generate a level-shifted signal comprising discrete-time samples as an output and to provide the level-shifted signal to a circuit from the plurality of circuits, wherein a level of the level-shifted signal is shifted from a level of the input signal, wherein the level-shifted sampling means is embodied in the deep N-well or the deep P-well, wherein the level-shifting sample and hold circuit is configured to be powered from a third voltage reference and a fourth voltage reference different from and floating with respect to the first voltage reference and the second voltage reference;

wherein the input of the integrated circuit is compatible with DC coupling to an output signal from a transmitter.

* * * * *